United States Patent
Yatougo et al.

(10) Patent No.: US 6,876,548 B2
(45) Date of Patent: Apr. 5, 2005

(54) COOLING DEVICE FOR ELECTRONIC UNIT

(75) Inventors: Isamu Yatougo, Sakura (JP); Mutumi Suwada, Matsudo (JP); Takaaki Katsumata, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 10/768,113

(22) Filed: Feb. 2, 2004

(65) Prior Publication Data

US 2004/0150951 A1 Aug. 5, 2004

Related U.S. Application Data

(63) Continuation of application No. 10/166,686, filed on Jun. 12, 2002, now Pat. No. 6,757,168.

(30) Foreign Application Priority Data

| Jun. 13, 2001 | (JP) | ........................................ | 2001-179199 |
| Aug. 1, 2001 | (JP) | ........................................ | 2001-234124 |
| Oct. 2, 2001 | (JP) | ........................................ | 2001-306381 |

(51) Int. Cl.[7] .................................................. H05K 7/20
(52) U.S. Cl. ........................ 361/690; 361/692; 165/80.3
(58) Field of Search ............................ 312/236; 62/418, 62/419; 165/80.3, 185, 121–126; 174/16.1; 454/184; 361/627, 690, 687, 692, 694, 695, 704, 707, 715–720

(56) References Cited

U.S. PATENT DOCUMENTS

| 4,646,202 A | | 2/1987 | Hook et al. | |
| 4,699,208 A | * | 10/1987 | Wolf et al. | .................... 165/47 |
| 4,899,211 A | | 2/1990 | Dumoulin | |
| 5,422,787 A | | 6/1995 | Gourdine | |
| 5,424,915 A | | 6/1995 | Katooka et al. | |
| 5,493,457 A | * | 2/1996 | Kawamura et al. | ........ 369/75.1 |
| 5,559,673 A | * | 9/1996 | Gagnon et al. | ............. 361/695 |
| 5,706,170 A | | 1/1998 | Glovatsky et al. | |
| 5,715,140 A | | 2/1998 | Sinkunas et al. | |
| 5,869,919 A | * | 2/1999 | Sato et al. | ...................... 313/17 |
| 6,359,779 B1 | * | 3/2002 | Frank et al. | ................. 361/687 |
| 6,360,814 B1 | | 3/2002 | Tanaka et al. | |
| 6,397,929 B1 | | 6/2002 | Sterner | |
| 6,462,948 B1 | * | 10/2002 | Leija et al. | .................. 361/697 |
| 6,538,881 B1 | * | 3/2003 | Jeakins et al. | .............. 361/687 |

FOREIGN PATENT DOCUMENTS

| JP | 01095599 A | * | 4/1989 | ............ H05K/7/20 |
| JP | 9-207691 | | 8/1997 | |

* cited by examiner

Primary Examiner—Anatoly Vortman
(74) Attorney, Agent, or Firm—Oblon, Spivak, McClelland, Maier & Neustadt, P.C.

(57) ABSTRACT

An electronic unit cooling device for housing an electronic unit having a plurality of electronic parts and for cooling the electronic unit with the cooling air which is introduced from the outside and discharged to the outside. The cooling device comprises: a cooling panel of a hollow structure adapted to contacted by at least one electronic unit for passing the cooling air therethrough; and a housing the cooling panel and the electronic unit and having an opening the cooling air to the cooling panel.

21 Claims, 20 Drawing Sheets

FIG. 8A    FIG. 8B
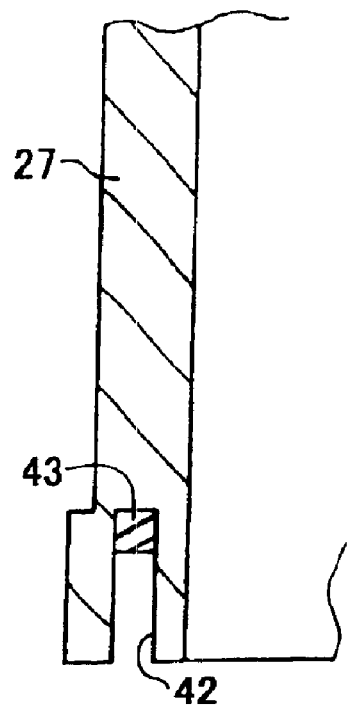
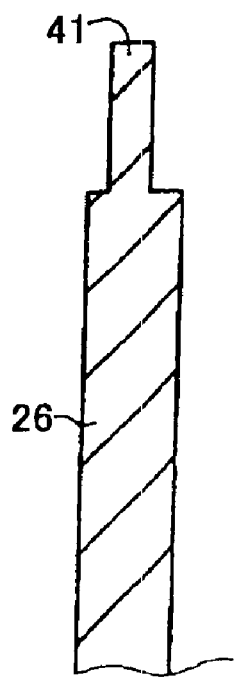
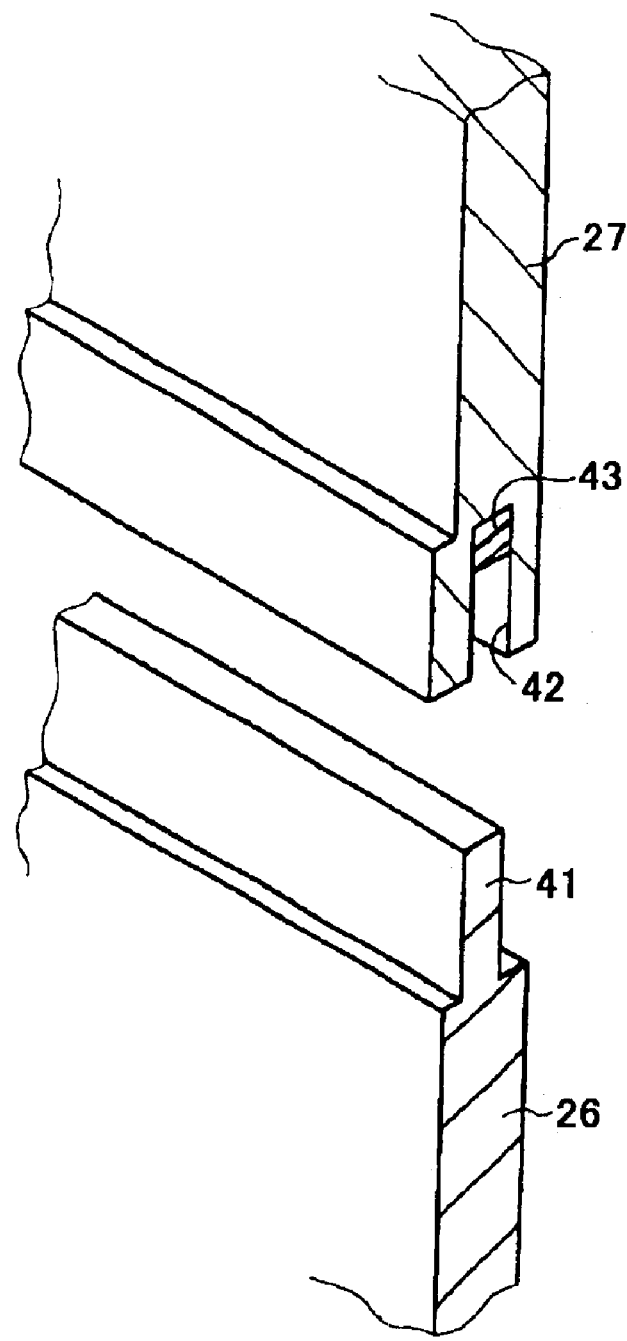

COOLING DEVICE FOR ELECTRONIC UNIT

CROSS-REFERENCE TO RELATED APPLICATIONS

The present application is a continuation of U.S. application Ser. No. 10/166,686 filed on Jun. 12, 2002, now U.S. Pat. No. 6,757,168 and in turn claims priority to JP 2001-179199 filed on Jun. 13, 2001, JP 2001-234124 filed on Aug. 1, 2001, and JP 2001-306381 filed on Oct. 2, 2001, the entire contents of each of which are hereby incorporated herein by reference.

BACKGROUND OF THE INVENTION

1. Field of the Invention

The present invention relates to a device for cooling an electronic unit constructed by combining electronic parts such as arithmetic elements or functional elements and, more particularly, to a device for cooling an electronic unit by passing the cooling air through a passage of a sealed structure and by releasing the heat from the electronic unit to the cooling air.

2. Related Art

In recent years, the electronic device has been used in various fields, and the degree of integration and the operating frequency of electronic parts composing the electronic device have risen higher and higher. Therefore, the calorific density has risen so that the electronic parts have taken high temperatures easily. In order to avoid malfunctions resulting from the temperature rise, there has been needed a cooling device having a higher capacity.

The air-cooling method for releasing the heat to the atmosphere is the most common for cooling the electronic device or electronic parts. This air-cooling method has been exemplified in the prior art by the forced air-cooling, in which the heat is evolved from the electronic parts by using a cooling fan to establish a cooling wind, or by the so-called "natural cooling", in which the heat is evolved from the electronic parts by a cooling wind caused by the natural convection.

When the electronic parts are to be air-cooled, the efficiency of this air-cooling can be raised if the electronic parts are exposed directly to the cooling air, because of a high heat transfer rate from the electronic parts to the cooling air. In order to prevent the electronic parts from being contaminated with dust or the like or the circuits from being shorted, however, the cooling air has to be cleaned in advance by filtering it when the electronic parts are contacted directly by the cooling air.

Generally in the prior art, on the other hand, there is mounted on the vehicle an electronic control unit (as will be called the "electronic unit") for controlling the engine or the like. This electronic unit generates heat when activated, so that the hot electronic unit is naturally cooled or forcedly cooled with an air-cooling device.

In the prior art, the electronic unit has been arranged inside of the vehicle. In recent years, however, there has been adopted the construction in which the electronic unit is arranged in the engine room.

When the engine controlling electronic unit is arranged inside, for example, electric wires (or a wire harness) for connecting the engine and the electronic unit have to be led in the engine room so that they are elongated. At the same time, the electric wires have to pass through a hole formed in the body panel partitioning the vehicle compartment and the engine room so that the works are troublesome to cause a rise in the cost.

If the electronic unit is arranged in the engine room, on the other hand, the through hole need not be formed in the body panel, and it is possible to shorten the length of the wires and to reduce the weight of and the cost for the concomitant parts. At the step of mounting the engine on the vehicle, moreover, the works to lead the electric wires can be simplified, and the electric wires can be prevented from being damaged or broken. In addition, the leading works are simplified to improve the maintainability and serviceability advantageously.

However, the engine room is in a hot atmosphere because the heat generated by the run of the engine is dissipated into the air of the room. In order to suppress the transfer of the heat in the engine room to the electronic unit, therefore, it is essential to arrange the electronic unit in the engine room while being confined in a housing box. Moreover, this housing box for housing the electronic unit is required to have not only the heat insulation and the cooling property but also the dust-proof and the water-proof sufficiently.

Especially, the electronic unit is intrinsically composed of the electronic parts which premise the use at the room temperature. Therefore, the electronic unit is warranted for its action when the ambient temperature around the electronic unit is at 80° C. or lower and when the temperature of the electronic elements in the electronic unit is at 105° C. or lower. For this warranty, there is needed not only the insulating function of the housing box but also the cooling function to suppress the temperature rise of the electronic unit.

This device for air-cooling the electronic unit is disclosed in Japanese Patent Laid-Open No. 9-207691. The cooling device disclosed is constructed such that an electronic unit composed of electronic parts is so housed in a cooling box having a cooling air passage defined and formed as to adjoin the passage. The electronic device is cooled by passing the cooling air through the passage. According to this construction, the electronic unit composed of the electronic parts or electronic circuits is not contacted directly by the cooling air so that the cooling device can be properly used even in case the electronic unit of the electronic parts is placed under relatively severe environmental conditions.

However, the so-called "inner two or three faces" of the cooling box constructing the cooling air passage are left as heat receiving faces so that the air-cooling device can cool only one electronic unit simultaneously.

In case the housing box of the aforementioned construction is modified to house two or more electronic units, on the other hand, the passage construction for the cooling air is so complicated that it cannot retain a sufficient cooling ability. Therefore, the temperature in the housing box may rise to cause malfunctions of the electronic units.

In this case, more specifically, these two electronic units occupy the housing capacity of the inside of the housing box at a high ratio. Therefore, it is difficult to retain a sufficient cooling passage for the electronic units with the resultant disadvantage that the cooling passage is short of cooling the electronic units.

If the cooling passage is enlarged or intensified to retain the sufficient cooling ability, therefore, the housing box itself is large-sized to cause another disadvantage that the place for the housing box is restricted.

In the housing box having the aforementioned cooling structure, moreover, the passage for passing the cooling air is arranged around the electronic unit. Therefore, the space is arranged to enclose the electronic unit so that the housing box itself is large-sized to occupy a relatively large volume of the engine room. Especially in the passage of the cooling air, the side walls of the passage act as the outer walls of the housing box or are contacted by or positioned near the outer walls, so that the cooling air to pass through this passage is seriously influenced by the heat transferred from the outside to the outer walls of the housing box. For reducing this influence and retaining the sufficient cooling ability, therefore, it is necessary to increase the flow rate of the cooling air and to retain a large internal volume of the passage. This necessity causes a tendency to enlarge the passage.

When the engine room has little surplus space for the arrangement, therefore, the enlarged housing box interferes with other parts thereby to cause a disadvantage that the works to assemble the parts are difficult.

Depending on the arrangement of the housing box, moreover, the ventilation of the wind of the radiator fan or the running wind may drop so that the cooling efficiency of the engine is insufficient. Therefore, the engine performance may be restricted, and the ability of the engine may not be fulfilled.

In the structure disclosed in the above-specified Laid-Open, moreover, the cooling box is opened upward, and the electronic unit of the sealed structure is arranged in the cooling box. Therefore, that portion on the upper side of the electronic unit, at which the temperature easily rise, is located on the open side of the cooling box so that it fails to receive the cooling through the cooling box. Moreover, the cooling air is fed from an intermediate position of one side portion of the cooling box placed in an upright position and is discharged from an intermediate position of the other side portion. Therefore, a falling flow and a rising flow of the cooling air are established in the cooling box so that the flow of the cooling air is hardly fulfilled by the natural convection. As a result, there is still left a room for improvement in the cooling efficiency.

In the disclosed construction, moreover, the portion of the cooling box on the upper side of an inlet and an outlet for the cooling air is left as the so-called "dead zone", through which no cooling air passes, so that the electronic unit of the sealed structure has its substantial heat radiation area narrowed. There is also left a room for improvement in the cooling ability or the cooling efficiency.

SUMMARY OF THE INVENTION

An object of the invention is to provide an electronic unit cooling device which has an excellent cooling ability or efficiency and which can be small-sized.

Another object of the invention is to provide a an electronic unit housing box which is excellent in the cooling ability and which is made compact.

Still another object of the invention is to provide an electronic unit cooling device and an electronic unit housing box, which can be made compact while retaining a sufficient cooling ability even when they house a plurality of electronic units.

In the cooling device of the invention, the electronic unit for generating heat when activated is held in contact with a cooling panel, through which the cooling air passes. Therefore, the heat generated in the electronic unit is taken by the cooling air flowing through the inside of the cooling panel, so that the electronic unit is cooled down. Moreover, the cooling panel is provided with a plurality of heat receiving faces so that a plurality of electronic units can be simultaneously cooled down. Moreover, the individual electronic units are kept away from contact with the cooling air so that they are not disadvantageously contaminated.

By forming a passage in the cooling panel with a partition, on the other hand, the portion insufficient for the ventilation of the cooling air, that is, the so-called "hot spot" is eliminated to improve the cooling efficiency of the electronic unit.

If a plurality of electronic units are contacted at their individual upper faces by the cooling panel, moreover, the heat is released from the portions of the electronic units, in which the temperature easily rises, so that the cooling efficiency can be improved to prevent the temperature rise in the electronic units effectively.

In the cooling device of the invention, still moreover, the cooling panel and the electronic unit can be held in a stacked state so that the entire construction of the device can be made compact.

In this construction, the entire insides of the cooling panels divided vertically are made into one passage by connecting the vertically divided cooling panels through a communication passage. Therefore, no hot spot can be formed to cool down the individual electronic units efficiently.

In the invention, on the other hand, the housing box for shielding the electronic unit from the outside and the cooling panel for releasing the heat from the electronic unit are made as separate parts so that the degree of freedom for the design can be improved. Moreover, the cooling air to flow through the inside of the cooling panel is hardly subjected to the influence of the heat outside of the housing box, so that the cooling efficiency of the electronic unit is improved.

Moreover, an inlet and an outlet for feeding and exhausting the cooling air to and from the cooling panel extend through the housing box, and their through portions are sealed with a seal member. Even if the electronic unit is arranged in the engine room of an automobile, therefore, it can be prevented from being contaminated or thermally influenced by the outside.

The piping for the cooling air is facilitated by arranging those inlet and outlet adjacent to each other and by protruding them from the housing box.

The above and further objects and novel features of the invention will more fully appear from the following detailed description when the same is read with reference to the accompanying drawings. It is to be expressly understood, however, that the drawings are for the purpose of illustration only and are not intended as a definition of the limits of the invention.

BRIEF DESCRIPTION OF THE DRAWINGS

FIG. 8A is an enlarged transverse section of a joint portion between a box body and an upper cover member of the specific embodiment, and FIG. 8B is a partially broken enlarged perspective view showing of the joint portion;

DETAILED DESCRIPTION OF THE PREFERRED EMBODIMENTS

Figure 1:
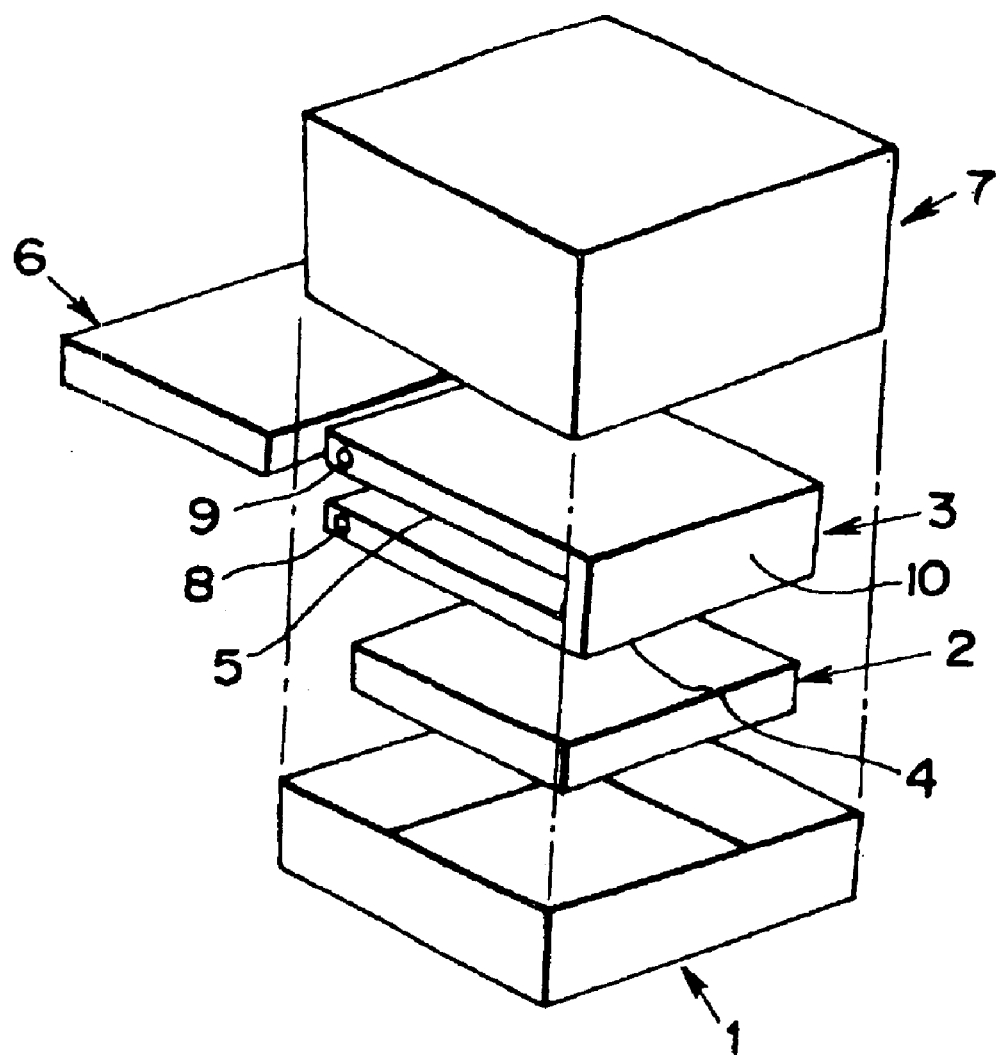
FIG. 1 is a perspective view showing one specific embodiment of the invention.
Figure 2:
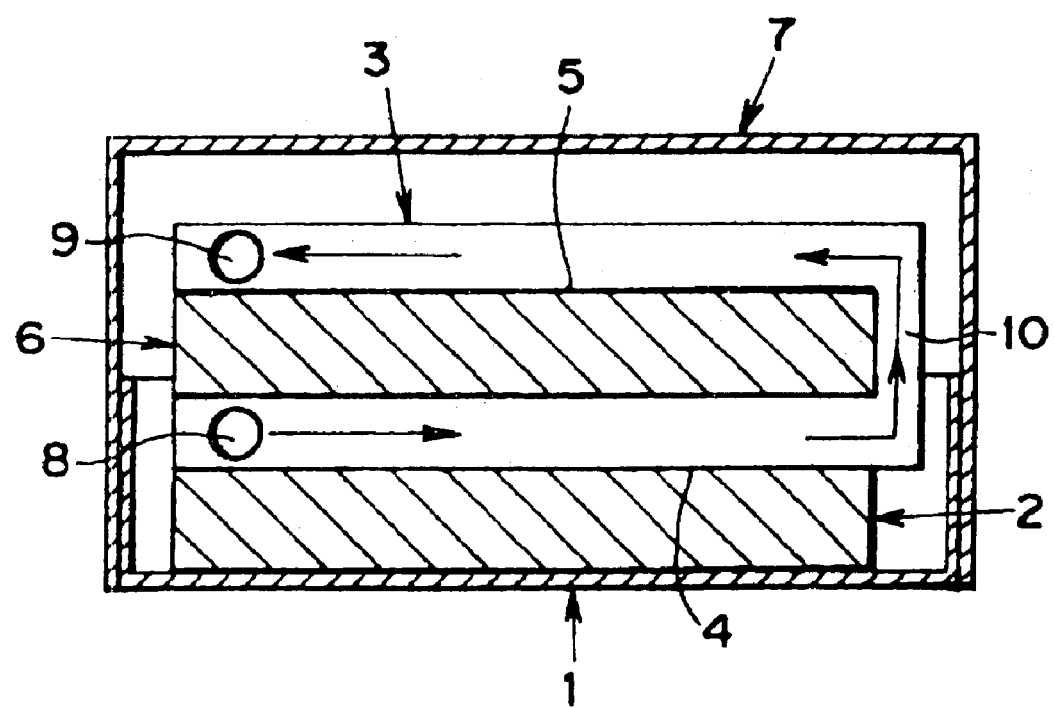
FIG. 2 is a longitudinal section of the specific embodiment shown in FIG. 1.

Specific embodiments of the invention will be described with reference to the accompanying drawings. FIG. 1 is a diagram showing one embodiment of a construction for cooling an electronic unit arranged in the engine room of a vehicle. On the other hand, FIG. 2 is a longitudinal section of the device shown in FIG. 1. In this embodiment, the whole device is housed in an outer box. This outer box body 1 is formed into a rectangular parallelepiped having a generally square bottom face, and a first electronic unit 2 is housed in the outer box body 1. This first electronic unit 2 is constructed mainly of parts for generating heat inevitably when energized to act, such as integrated circuits or power transistors.

Over the first electronic unit 2, there is arranged a cooling panel 3 which has a cooling air passage of a sealed structure defined and formed by a partition. This cooling panel 3 is a hollow member made of a metal or synthetic resin having an excellent heat conductivity, and has a structure in which flat plate portions arranged in parallel are made to communicate with each other at their side end portions. This cooling panel 3 is contacted at its bottom face in a heat transferable manner by the upper face of the first electronic unit 2. Therefore, the bottom face of the cooling panel 3 provides a first heat receiving face 4.

Between the upper side flat plate portion and the lower side flat plate portion, as contacted by the first electronic unit 2, of the cooling panel 3, there is inserted into and sandwiched a second electronic unit 6 which generates a heat when energized to act. Moreover, the upper face of this second electronic unit 6 is contacted in a heat transferable manner by the lower face of the upper side flat plate portion. Therefore, the lower face of the upper side flat plate portion provides a second heat receiving face 5.

The outer box body 1 is covered with an outer box cover 7 such that the individual electronic units 2 and 6 and the cooling panel 3 thus laminated in the so-called "three-layered structure".

In the cooling panel 3, a cooling air inlet 8 is formed in the leading end portion of the lower side flat plate portion, and a cooling air outlet 9 is formed in the leading end portion of the upper side flat plate portion. In other words, the inlet 8 and the outlet 9 are formed in those end portions of the individual flat plate portions that are opposed to a communication portion 10 joining the flat plate portions. Here, these inlet 8 and outlet 9 are opened to the outside of the outer box which is constructed of the outer box body 1 and the outer box cover 7.

In the cooling device shown in FIGS. 1 and 2, the upper face of the first electronic unit 2 is contacted by the first heat receiving face 4, and the second electronic unit 6 is contacted by the second heat receiving face 5, so that the heats generated by the actions of those electronic units 2 and 6 are transferred to the heat receiving faces 4 and 5, respectively. On the other hand, the ambient air, i.e., the cooling air is fed from the inlet 8. The cooling air flows at first through the lower side flat plate portion so that it absorbs the heat from the lower face of the flat plate portion, i.e., the first heat receiving face 4. As a result, the first electronic unit 2 is indirectly air-cooled. Then, the first electronic unit 2 has its heat absorbed from its upper face so that it is efficiently cooled down.

The cooling air having its temperature raised to some extent by absorbing the heat from the first electronic unit 2 is caused to flow through the communication portion 10 to the upper side flat plate portion by the natural convection and further to flow in the upper side flat plate portion to the outlet 9. In this meanwhile, the cooling air flows in contact with the lower face of the upper side flat plate portion, i.e., the second heat receiving face 5 thereby to absorb the heat therefrom. As a result, the second electronic unit 6 contacted by the second heat receiving face 5 is indirectly air-cooled. Then, the second electronic unit 6 has its heat absorbed from its upper face so that it is efficiently cooled down.

Thus, in the cooling device according to the invention, the cooling air flows only in the cooling panel 3, i.e., inside of the cooling air passage but is not directly contacted by the electronic units 2 and 6 so that these electronic units 2 and 6 are not adversely affected or contaminated with the cooling air. Therefore, restrictions on the places for the electronic units 2 and 6 can be eliminated or lightened.

On the other hand, the cooling device can cool the two electronic units 2 and 6 simultaneously, and these cooling operations are efficient because the heat is absorbed from the individual upper faces of the electronic units 2 and 6. Moreover, these electronic units 2 and 6 can be arranged by stacking them so that the entire construction including the cooling panel 3 can be made compact. Still moreover, the cooling air is fed from the inlet 8 to the inside of the lower side flat plate portion. After this, the cooling air flows through the communication portion 10 to the upper side flat plate portion, from which it is discharged to the outlet 9, so that the air flow direction is turned upward. As a result, the cooling air passage takes a shape along the flow so that the cooling air flow can be smoothed to improve the cooling efficiency in this respect.

Here, each of the flat plate portions can be provided therein with a partition (or baffle). With this construction, the cooling air can be made turbulent in the individual flat plate portions, i.e., on the individual heat receiving faces 4 and 5. As a result, the rates of heat transfer of the cooling air to the individual heat receiving faces 4 and 5 can be improved to cool down the individual electronic units 2 and 6 more efficiently.

On the other hand, the sectional shape of the cooling panel 3 in the invention should not be limited to the aforementioned one but can be modified into a suitable one, if necessary.

Here will be described another specific embodiment of the invention.

Figure 3:
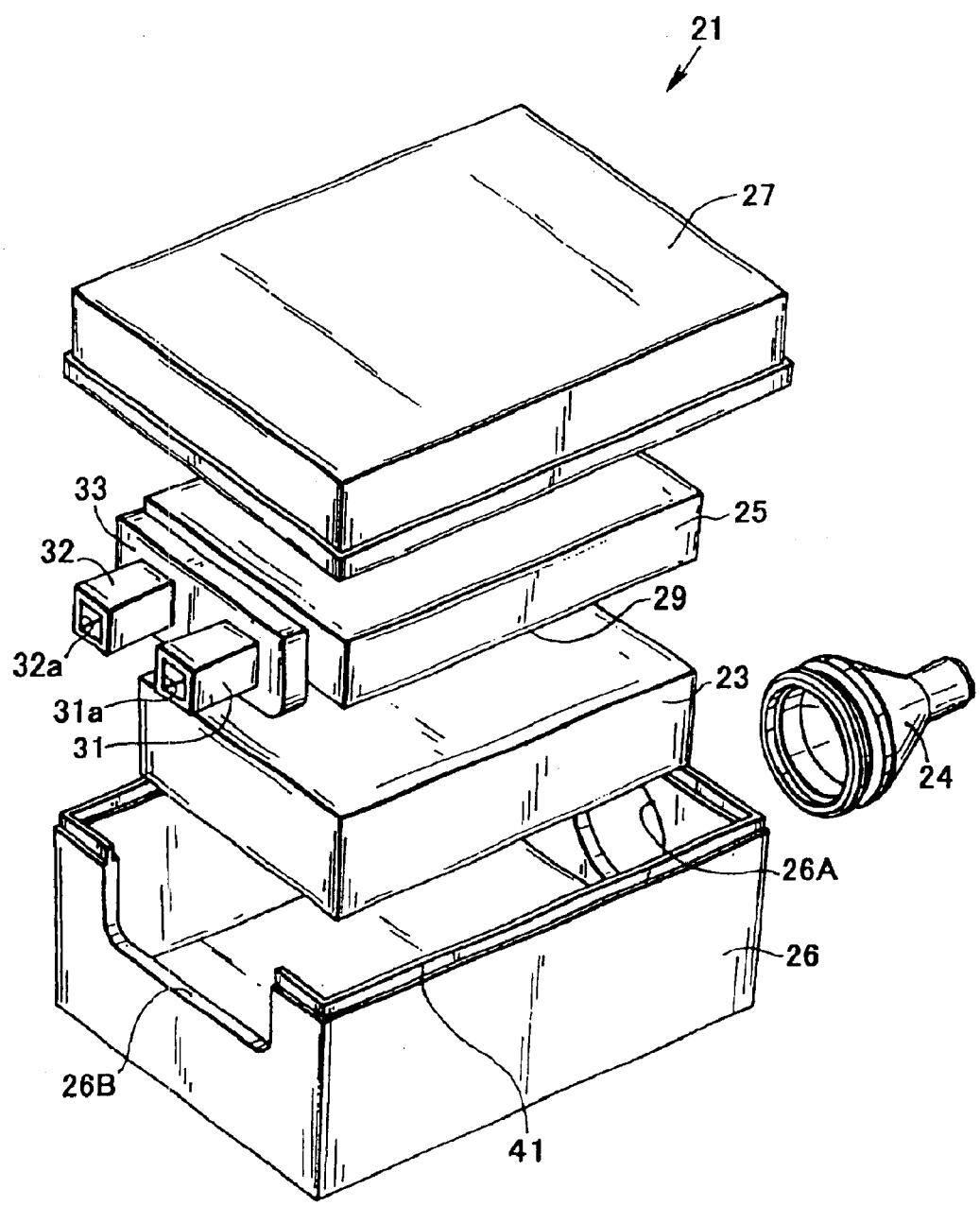
FIG. 3 is an exploded perspective view of an essential portion showing the entire construction of another specific embodiment of the invention.
Figure 4A:
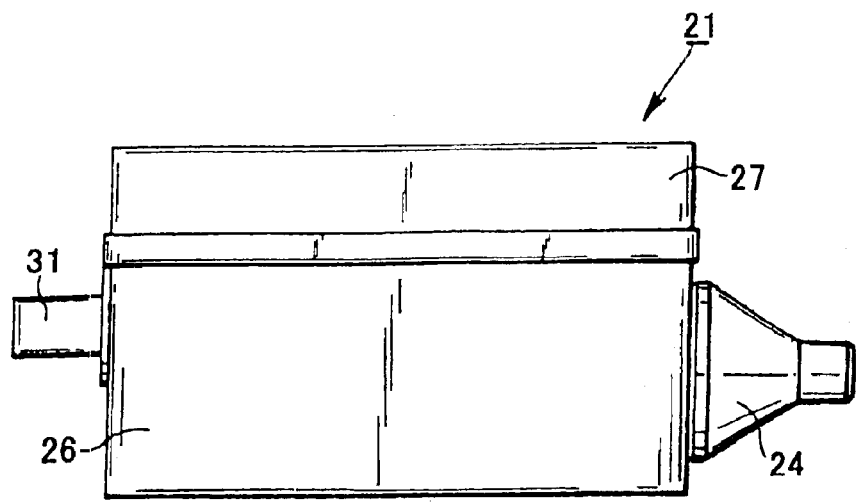
FIG. 4A is a front elevation of a housing box of the specific embodiment.
Figure 4B:
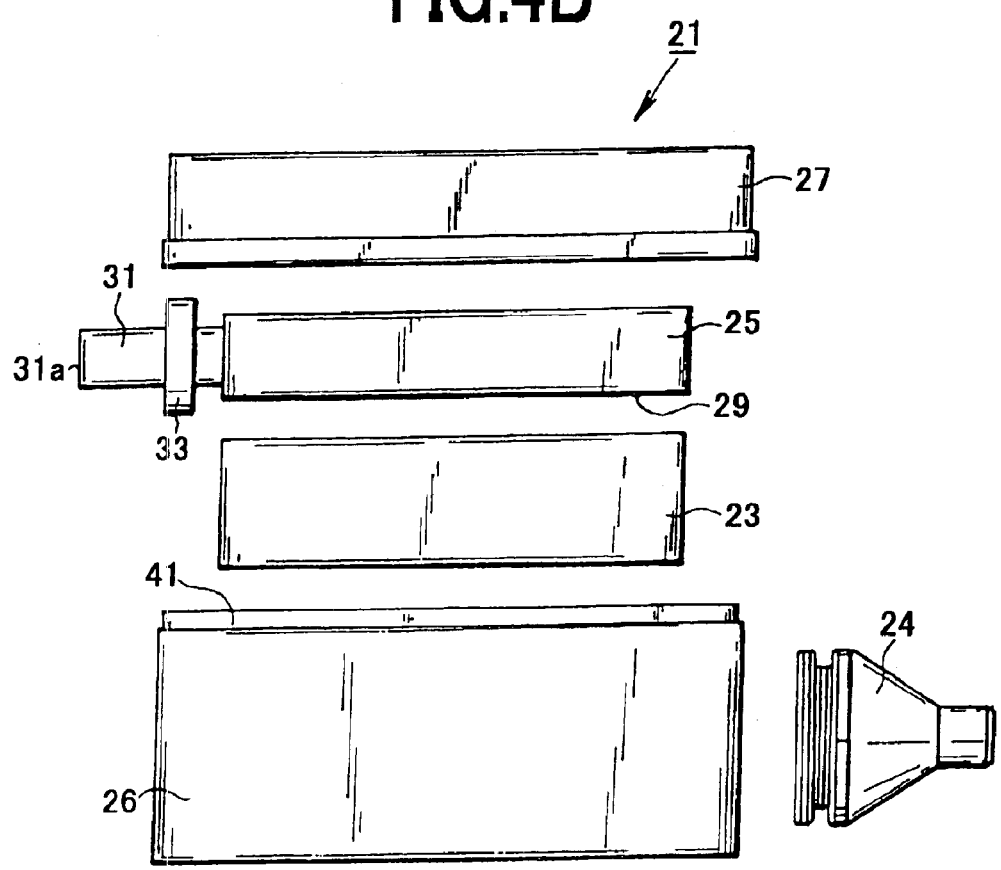
FIG. 4B is a front elevation showing the state in which the housing box is disassembled.
Figure 5A:
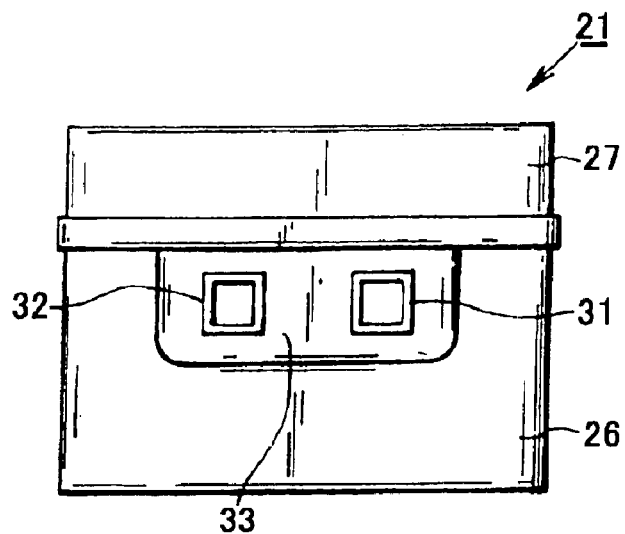
FIG. 5A is a lefthand side elevation of the housing box.
Figure 5B:
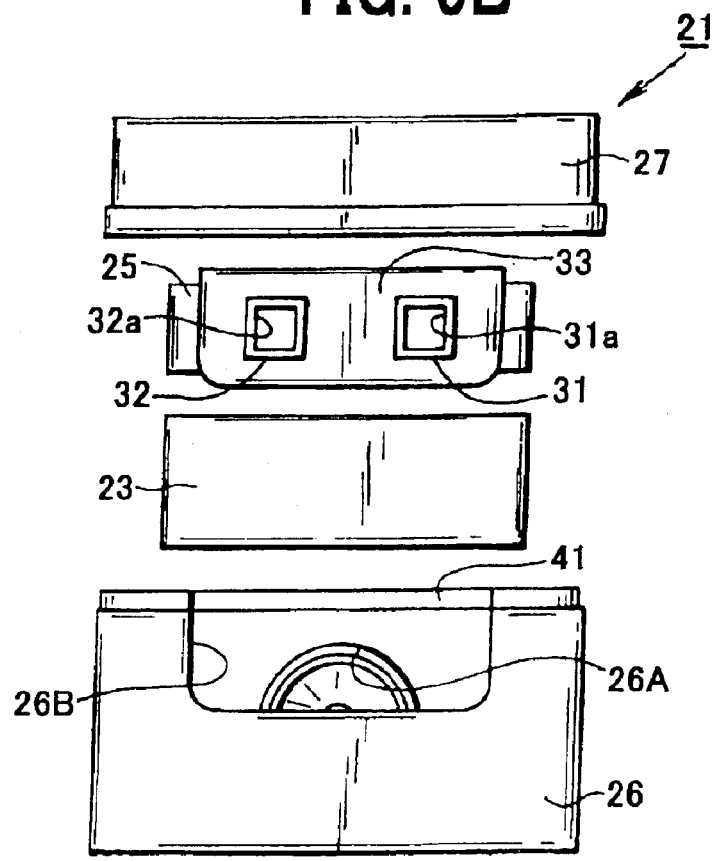
FIG. 5B is a lefthand side elevation showing the state in which the housing box is disassembled.
Figure 6:
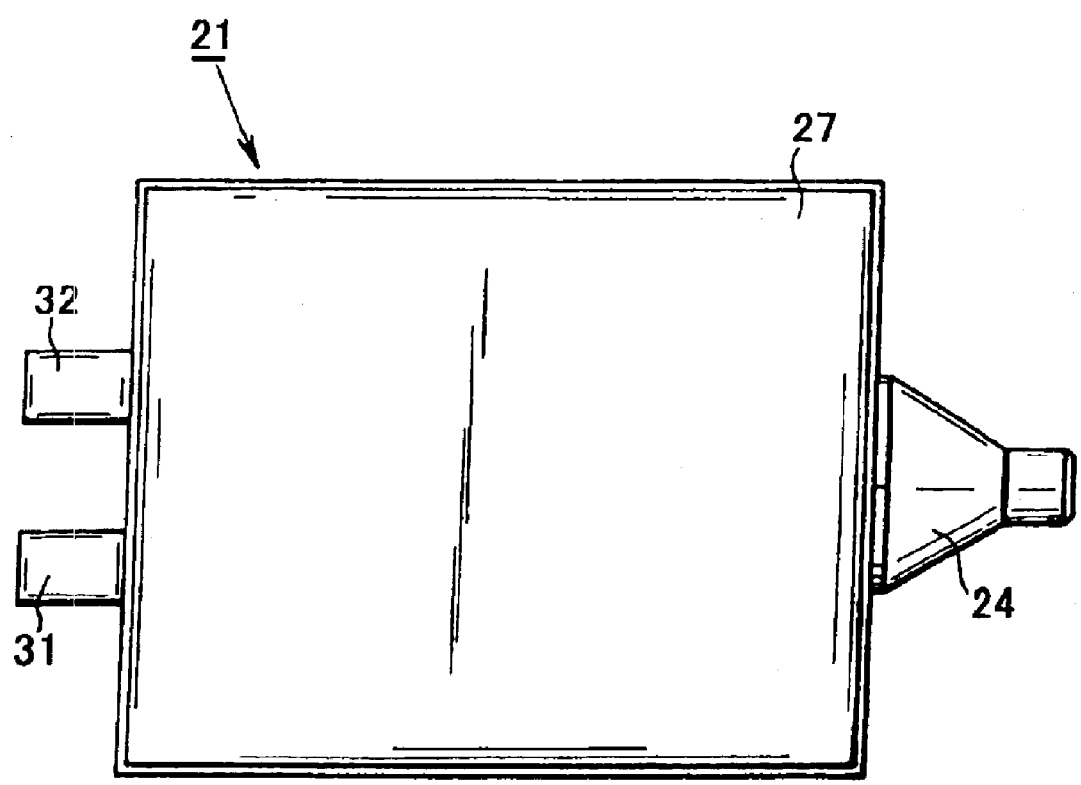
FIG. 6 is a top plan view of the housing box.

FIG. 3 is an exploded perspective view showing the individual portions of the main construction of the housing box 21 of the invention. FIG. 4A is a front elevation of the same, and FIG. 4B is an exploded front elevation of the individual portions of the same. Moreover, FIG. 5A is a lefthand side elevation of the same, and FIG. 5B is an exploded lefthand side elevation of the individual portions of the same. FIG. 6 is a top plan view of the same. In the shown embodiment, an electronic unit 23 housing an electronic device composed of electronic parts in the case is housed in a housing box 21 having water-proof, dust-proof, heat-resisting and cooling functions. Here, the housing box 21 of the electronic unit 23 will be described on the embodiment which is applied to a vehicle by arranging the housing box 21 in the engine room. Moreover, the electronic device of this embodiment will be exemplified by a control unit, i.e., an important part for controlling the (not-shown) engine or the (not-shown) transmission unit electronically.

This electronic device (although not shown) is basically constructed by mounting the various (not-shown) electric parts or (not-shown) electronic parts in a predetermined manner on the (not-shown) circuit substrate which is printed with wiring patterns of the circuit, and is so housed in the case as to retaining the protections of those electric/electronic parts against electromagnetic waves, shocks or heat radiations.

These electric parts or electronic parts generate heats inevitably when energized to act, and temperature ranges are defined for warranting the rated actions of those parts. As the temperature in the case including the parts rises to or over the action warranting temperature of the individual parts although different according to the action situations of the electronic device, therefore, the electric circuit actions may malfunction or may invite malfunctions or troubles of the parts.

Here, the electronic unit 23 is provided at a predetermined position of its side face with the (not-shown) connector which is connected with the input/output lines of the electronic device in the electronic unit 23. This electronic unit 23 is electrically connected with the external various devices through the (not-shown) wire harness in which wires to be connected with that connector are bundled.

By this wire harness, more specifically, the electronic unit 23 is connected with: the (not-shown) battery or power source so that it is fed with the operating current; the output lines of the (not-shown) various sensors at predetermined positions so that it is fed with sensor signals; the (not-shown) various input devices so that it is fed with the various indication signals; the (not-shown) various actuators so that it outputs command signals; and the (not-shown) display device and the (not-shown) alarm device so that it outputs the display and alarm signals.

On the basis of these sensor signals and indication signals, moreover, the electronic device makes predetermined decisions and uses the various actuators to realize the controls according to the decisions. On the other hand, the electronic device uses the display device and the alarm device to display and inform the pieces of information obtained from the various sensors and the operating situations of the individual devices, and to warm the malfunction.

This electronic unit 23 is housed in the housing box 21 with its face having the highest heat radiation being directed upward.

In this embodiment, the electronic unit 23 is formed into a flat box shape and is housed in the housing box 21 with its face of the largest surface area being vertically directed. Therefore, the height occupied in the housing box 21 by the electronic unit 23 is the smallest.

The face of the electronic unit 23 having the highest heat radiation is determined in the following manner. For the individual faces composing the case outer faces of the electronic unit 23, to which the heat generated by the action thereof is transferred, the average temperatures and the surfaces areas of the faces are multiplied, and the face having the largest one of the products of the individual faces is selected as the face having the highest heat radiation.

Moreover, what face has the highest heat radiation depends more or less on the position of the electronic unit 23 itself and the kind and the operating frequency of the electronic parts in the electronic unit 23. However, the construction, in which the electric/electronic parts are mounted on the circuit substrate, is the mainstream, as has been described hereinbefore, so that the numerous parts are arranged on a plane. Therefore, the case face to be selected confronts the substrate face, on which those parts are arranged, and has the largest surface area.

Thus, the electric/electronic parts of the electronic unit 23 are preferably arranged to transfer their operating heats positively to that face of the case of the electronic unit 23 which has the largest surface area. Moreover, the arrangement of the parts is desired to have no temperature heterogeneity but a substantially homogeneous temperature distribution on that face. In this case, the heat exchange with a later-described cooling panel 25, to which the working heat is transferred from that face, and the later heat exchange between the cooling panel 25 and the cooling air are not heterogeneous but can be efficient to minimize the thermal load and fatigue thereby to improve the durabilities of the parts.

Moreover, the housing box 21 is constructed to include: the cooling panel 25, on which the electronic unit 23 is removably mounted; an outer box body 26 for housing the cooling panel 25 therein; and an upper cover member 27.

The ducts outside of the housing box 21 can be connected to the cooling panel 25, and the wires can be connected with the electronic unit 23. Specifically, the housing box 21 houses not only at least one electronic unit 23 with the face of much heat radiation being directed upward but also the cooling panel 25 which is either confronted by at least the upper face of the electronic unit 23 through a clearance or is contacted by that upper face and which is formed into the hollow shape for passing the cooling air therethrough.

Here, at least the box body 26 and the upper cover member 27 are made of a synthetic resin having an excellent heat conductivity such as polypropylene or polyamide to lighten the weight and lower the cost and to retain the heat resistance sufficiently for the place such as the engine room where a high heat source is disposed.

Specifically, this box body 26 is formed into the box shape which is opened upward and its inner shape has a predetermined size similar to that of the outer shape of the electronic unit 23. The box body 26 is set to have a height larger by a predetermined height than the sum of the heights of the electronic unit 23 and the cooling panel 25 so that it can house the electronic unit 23 and the cooling panel 25 in stack. In that side face of the box body 26 which is confronted by the (not-shown) connector of the electronic unit 23, moreover, there is formed an opening 26A which has a circular open shape, so that it can mount a grommet type seal member 24 for the (not-shown) wire harness to be connected to that connector.

Specifically, the seal member 24 is constructed to include: a ring-shaped root portion to be fitted in the opening 26A; and a pipe-shaped leading end portion joined to the root portion through a conical intermediate portion. The wire harness can be held by the pipe-shaped leading portion. Moreover, these individual portions of the seal member 24 are integrally formed of an elastically deformable material such as rubber having an insulation and a flexibility.

When the electronic unit 23 housed in the housing box 21 is to be electrically connected with the external device through the wire harness, therefore, the seal member 24 for the wire harness is interposed between the wire harness and the opening 26A so that the wire harness may pass through the opening 26A formed in the box body 26. Thus, it is possible to retain the sealing performance of the box body 26 and to protect the wire harness.

The upper cover member 27 is formed into a flat box shape having a planar shape identical to that of the box body 26 and opened in its lower side so that it can close the upper opening of the box body 26.

On the other hand, the cooling panel 25 is formed of a synthetic resin having an excellent heat conductivity, into a hollow shape having a planar shape similar to that of the electronic unit 23 housed in the housing box 21, and is set to have a bottom face of a surface area at least equal to or larger than that of the upper face of the electronic unit 23.

Moreover, the bottom face of the cooling panel 25 is either confronted by a[least the upper face of the electronic unit 23 through a predetermined clearance or contacted by that upper face in a heat transferable manner, and provides a heat receiving face 29.

Therefore, the bottom face of the cooling panel 25 is confronted or contacted by that upper face of the electronic unit 23, which has the highest heat radiation, so that the heat generated is easily concentrated by the natural convection. Moreover, the operating heat of the electronic unit 23 is transferred from the upper face of the electronic unit 23 having the largest surface area to the heat receiving face 29 of the cooling panel 25 so that a high heat efficiency can be obtained.

Moreover, the receiving face 29 of the heat from the electronic unit 23 is positioned at a lower level than that of the joint portion between the upper cover member 27 and the box body 26. Therefore, the influence from the outside of the housing box 21 is reduced to make the stable heal transfer from the upper face of the electronic unit 23 to the heat receiving face 29 of the cooling panel 25.

Here, a soft member such as urethane for absorbing vibrations may be interposed between the electronic unit 23 and the cooling panel 25 so that the vibrations accompanying the running of the vehicle or the operations of the various devices such as the engine in the engine room may not be transmitted to the electronic unit 23.

On the other hand, the cooling panel 25 is integrally provided with an inlet 31 and an outlet 32 for the cooling air. By defining the inside of the cooling panel 25, moreover, the inlet 31 and the outlet 32 are arranged close to each other in the side face of the cooling panel 25.

Specifically, these inlet 3] and outlet 32 are formed into a pipe shape having a square transverse section and are disposed to protrude in parallel with each other at a right angle with respect to the side face of the cooling panel 25 from the portions spaced widthwise in that side face. Moreover, the inlet 31 and the outlet 32 communicate with the inside of the cooling panel 25 and are provided at their leading ends with ports 31a and 32a which are opened in a square shape.

Moreover, that side face of the box body 26 which correspond to the inlet 31 and the outlet 32 of the cooling panel 25 is cut from its upper open end portion to form an opening 26B which is shaped in a rectangular shape. The leading ends of the inlet 31 and the outlet 32 are protruded to the outside through that opening 26B.

Moreover, a seal member 33 is disposed at an intermediate position of the protruded extensions of those inlet 31 and outlet 32.

Specifically, this seal member 33 is attached to that portion of the housing box 21 which is confronted by the outer wall from the inlet 31 and the outlet 32, when the cooling panel 25 is housed in the housing box 21, and is protruded in a flange shape over that portion.

Moreover, the seal member 33 is so made of a soft and elastic material such as rubber as to have a larger thickness than those of the side walls of the box body 26 and the upper cover member 27. In this seal member 33, moreover, there are formed through holes which extend to the inlet 31 and the outlet 32 so that they retain the water/dust proofs between the inlet 31 and the outlet 32 and the seal member 33 when they are held in close contact with the individual outer circumferences of the inlet 31 and the outlet 32.

Still moreover, the seal member 33 is formed to have an outer peripheral edge shape substantially identical to the open shape of the opening 26B formed in the box body 26 so that its slightly upper base end may protrude from the peripheral edge of the box body 26.

When the upper cover member 27 is assembled with the box body 26, therefore, the root end side of the seal member 33, as taken in the inserting direction, is pushed in this direction by the upper cover member 27 so that the leading end portion of the seal member 33 is pushed toward the opening 26B to eliminate the clearance inbetween. As a result, the water/dust proofs between the seal member 33 and the opening 26B can be obtained to retain the sealing performance sufficiently as the housing box 21 composed of the box body 26 and the upper cover member 27 while the inlet 31 and the outlet 32 being protruded from the housing box 21 through the opening 26B formed in the box body 26.

Moreover, the assemblability can be improved because the assembly does not involve the separate work of assembling the seal member 33 for the inlet 31 and the outlet 32.

Moreover, the inlet 31 and the outlet 32 are disposed close to the side face of the cooling panel 25 and protruded from in parallel with each other thereby to make it sufficient to form the single opening 26B in the box body 26 for passing the box body 26 therethrough. Therefore, the cost for machining the box body 26 while reducing the drop in the strength and the sealing performance of the box body 26, and the seal member 33 can be only one thereby to reduce the number of parts. Moreover, the cooling panel 25 is internally defined to form a predetermined passage so that the inlet 31 and the outlet 32 can be arranged at arbitrary positions. At the same time, it is possible to improve the efficiencies of the heat exchanges between the cooling panel 25 and the electronic unit 23 and between the cooling panel 25, to which the heat has been transferred, and the cooling air.

Figure 7A:
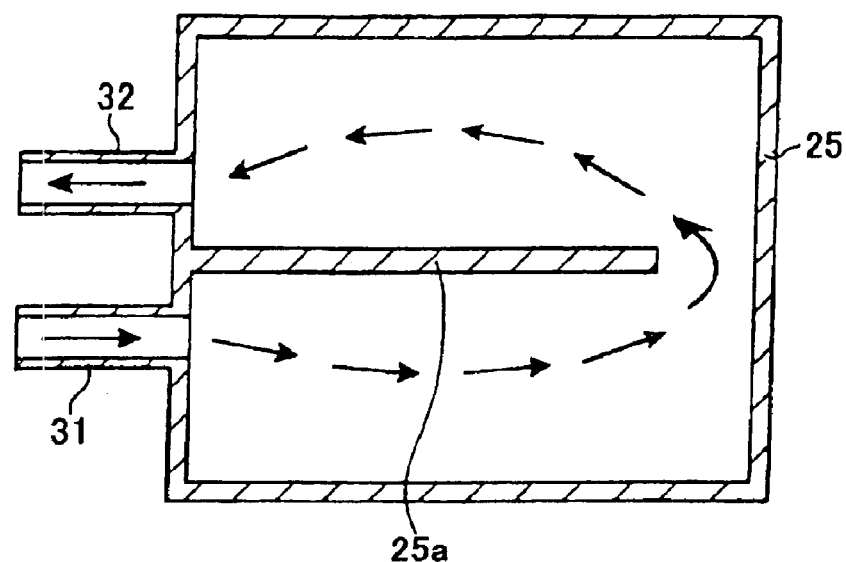
FIG. 7A is a sectional top plan view showing the flow of cooling air of the case in which the housing box is provided with a partition.

As shown in FIG. 7A, more specifically, the inside of the cooling panel 25 is divided into the side of the inlet 31 and the side of the outlet 32 while forming a communication portion by a central partition 25a which is extended at the intermediate portion between the inlet 31 and the outlet 32, as arranged in the side face of the cooling panel 25, from the inner wall face to the vicinity of the opposite wall face. In the cooling pane) 25, therefore, there is formed a U-shaped passage which circulates the whole area of the cooling panel 25 from the inlet 31 to the outlet 32.

By thus dividing the inside of the cooling panel 25 to form the arbitrary passage in the cooling panel 25 by the partition 25a, therefore, no restriction is exerted on the places where the inlet 31 and the outlet 32 are formed in the cooling panel 25. It is, therefore, possible to freely alter the arrangements of those inlet and outlet 31 and 32 and the suction/exhaust ducts to be connected with the inlet 31 and the outlet 32. Thus, it is possible to lead the ducts according to the surrounding structure, in which the housing box 21 is disposed, and the arrangement of the parts.

Although the single passage from the inlet 31 to the outlet 32 is defined and formed in the cooling panel 25, moreover, the passage may be once divided into a plurality of branches which are gathered at or near the outlet 32.

Therefore, the inlet 31 can be formed, for example, at such a position as can shield at least the radiation heat from the high temperature source or the engine in the engine room. In this modification, the temperature rise due to the radiation heat of the cooling air to be introduced into the cooling panel 25 can be suppressed even slightly to improve the cooling performance.

Moreover, the ports 31a and 32a of the inlet 31 and the outlet 32 are arranged close to each other. When the (not-shown) dedicated duct for feeding or discharging the cooling air is connected to the inlet 31 or the outlet 32, therefore, it can be easily mounted/demounted. When the mounted states of the two ducts are to be confirmed, on the other hand, the confirming operations can be easily done visually because the ports 31a and 32a of the two inlet and outlet 31 and 32 are gathered at one position.

Here the specific embodiment thus far described is constructed by protruding the inlet 31 and the outlet 32 from the common side face of the cooling panel 25 in the identical direction. However, the positions, the number and the shapes of the inlet 31 and the outlet 32 should not be limited thereto.

Specifically, the foregoing embodiment is constructed by protruding the inlet 31 and the outlet 32 from the box body 26. However, the construction may be modified to eliminate the protrusions of the inlet 31 and the outlet 32 from the box body 26 by making the outer face of the box body 26 and the open faces of the inlet 31 and the outlet 32 in a common plane.

According to this construction, therefore, the inlet 31 and the outlet 32 are not protruded to the outside so that the housing box 21 can be made compact and easily handled because of its less protrusions.

Moreover, the inlet 31 or the outlet 32 for feeding the cooling air may be provided by a plurality of stages, and the passage in the cooling panel 25 may also be divided and formed in plurality.

Even if the cooling air is fed in this modification under a pressure like that of the aforementioned one, therefore, the total rate of the cooling air per unit time to pass in the housing box 21 can be increased. Therefore, the heat to be transferred by the increased cooling air is also increased to enhance the cooling performance.

Moreover, the protrusions of the inlet 31 and the outlet 32 from the housing box 21 may be bent or curved at their intermediate portions to make the directions of their ports 31a and 32a different from or between the protruded direction of the inlet 31 and the outlet 32.

When the ports 31a and 32a of the inlet 31 and the outlet 32 are differently directed, therefore, ducts are connected in different directions to the inlet 31 and the outlet 32. It is, therefore, possible to retain the duct mounting or demounting properties sufficiently thereby to reduce the occasion for the mounting mistakes.

Moreover, the opening shapes of the inlet 31 and the outlet 32 are made identical but may be different from each other.

In this modification, therefore, the ports 31a and 32a of the inlet 31 and the outlet 32 are made to have different opening shapes. The ducts having mounted portions of correspondingly different opening shapes are connected to the ports 31a and 32a so that their mounting mistakes can be prevented.

Moreover, the aforementioned passage may be formed by dividing the inside of the cooling panel 25 not with the partition 25a integrated therewith but with a separate partition of the other member. In this modification, moreover, the member forming the passage in the cooling panel 25 is used as one for the separate partition. Therefore, this partition may be given not only the function to form the passage but also the function to promote the heat transfer from the cooling panel 25 to the cooling air.

Specifically, the contact area of the partition with the cooling air may be increased by providing the partition with heat radiation fins along the flow direction of the cooling air. In this modification, the heat transfer from the member forming the cooling panel 25 to the cooling air can be promoted to improve the cooling efficiency.

Moreover, the partition may be modified by forming a plurality of projections regularly or irregularly to establish moderate turbulences in the flow of the cooling air. In this modification, that portion of the cooling air which has little temperature rise because of no heat transfer from the component of the cooling panel 25 can be more frequently contacted by the heat radiating portion of that component. By agitating the cooling air flow, moreover, the temperature-raised air portion and the temperature-unraised air portion can be mixed and homogenized to increase the calorie to be absorbed by the cooling air thereby and to improve the cooling ability. Then, the cooling air introduced from the inlet 31 flows in the passage and through the substantially entire area in the cooling panel 25 until it reaches and leaves the outlet 32.

Figure 7B:
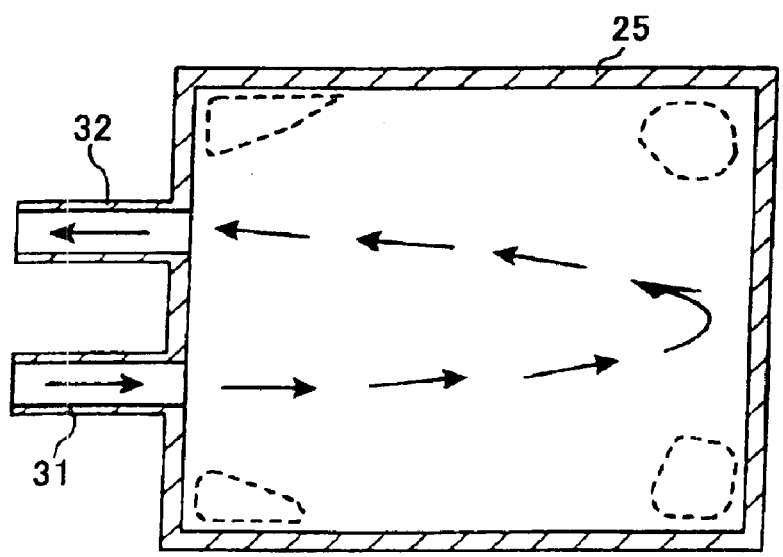
FIG. 7B is a sectional top plan view showing the flow of cooling air of the case in which the housing box is not provided with a partition.

Unless such passage is formed in the cooling panel 25, more specifically, the local areas, as shown by enclosures of broken lines in FIG. 7B, in the cooling panel 25 hardly admit the cooling air so that they become hot zones for the operating heat transferred from the electronic unit 23 to reside and continue their thermally saturated state. Therefore, the passage for transferring the heat from the electronic unit 23 to the cooling panel 25 is partially reduced so that the cooling ability of the cooling panel 25 is not exhibited to the maximum.

According to the construction shown in FIG. 7A, on the contrary, there is defined the passage of the cooling air from the inlet 31 through at least the heat receiving portion in the cooling panel 25 to the outlet 32 so that most of the heat transferred from the electronic unit 23 in the cooling panel 25 can always be carried away by the cooling air. Therefore, it is possible to improve the cooling efficiency of the electronic unit 23 by the cooling panel 25.

Moreover, the inlet 31 is connected to the (not-shown) pipe-shaped suction duct for feeding the ambient air to the cooling panel 25, and the outlet 32 is connected to the (not-shown) pipe-shaped exhaust duct for discharging the ambient air fed from the cooling panel 25.

Moreover, the leading end of the suction duct connected to the inlet 31 is disposed below the body of the vehicle on the forward leading end so that it can suck the ambient air. On the other hand, the trailing end of the exhaust duct connected to the outlet 32 is arranged near the suction side of the (not-shown) motor-driven fan disposed at the (not-shown) radiator unit in the engine room. As the fan in the radiator unit rotates, therefore, a vacuum is established to introduce the ambient air from the suction duct. This ambient air introduced passes in the cooling panel 25 of the housing box 21 until it is discharged from one end to the radiator side of the exhaust duct.

With the cooling panel 25 thus constructed, therefore, the upper face of the maximum surface area of the electronic unit 23 is confronted or contacted by the heat receiving face 29 or the bottom face of the cooling panel 25 so that most of the operating heat generated by the action of the electronic unit 23 is efficiently transferred to the heat receiving face 29. On the other hand, the ambient air or the cooling air is introduced from the inlet 31 into the cooling panel 25. This cooling air is guided in contact with at least the whole area of the heat receiving face or the lower face of the partitioned cooling panel 25 thereby to carry the heat away the heat receiving face 29. As a result, the electronic unit 23 is indirectly air-cooled. In the electronic unit 23 of this case, the generated heat is easily concentrated by the natural convection and is carried away the upper face of the largest surface area, so that the electronic unit 23 is efficiently cooled down.

Moreover, the cooling air having acquired the heat of the electronic unit 23 to have its temperature raised to some extent is discharged from the outlet 32 to the outside of the housing box 21.

Here, the electronic unit 23 may be fixed on the cooling panel 25 by providing brackets of a metal or resin at predetermined positions of the cooling panel 25. Alternatively, proper fixing means can be selected from lock members or a combination of bolts and nuts to be fastened.

Thus, in the cooling panel 25, the cooling air flows only in the passage but does not come into direct contact with the electronic unit 23. Therefore, the electronic unit 23 is not influenced or contaminated with the cooling air so that it can be kept clean. Especially even when the moisture entrained into the cooling panel 25 by the cooling air from the outside is evaporated by the high temperature in the engine room, the water vapor does not touch the electronic unit 23 but is discharged as it is from the housing box 21.

Moreover, the cooling panel 25 is enabled to cool the electronic unit 23 efficiently by carrying the heat away from the upper face of the electronic unit 23 so that the housing box 21 can be made compact as a whole. Especially, the face of the largest surface area of the electronic unit 23 is directed upward, and the operating heat is released from that upper face so that a high thermal efficiency can be achieved. As a result, the cooling panel need not be arranged on the remaining faces of the electronic unit 23, that is, around the electronic unit 23 so that the housing box 21 can be made compact.

Moreover, the electronic unit 23 is housed in the housing box 21 while being positioned to have its face of the largest surface area directed upward. Therefore, at least the electronic unit 23 itself is lowered in height, and the cooling panel 25 itself may be low according to the electronic unit 23 although depending upon the calorific power of the electronic unit 23 or the flow rate of the cooling air. Therefore, the height of the housing box 21 at the time when the upper cover member 27 is mounted on the box body 26 can be set to the smallest value while housing the electronic unit 23.

As a result, according to the housing box 21 having the suppressed height, the ventilation necessary for the wind or draft of the radiator fan in the engine room is hardly reduced by the housing box 21 so that a sufficient cooling efficiency of the engine can be achieved. Therefore, the capacity of the engine can be fully exhibited to improve the drivability of the vehicle. Moreover, the ventilation in the engine room is hardly deteriorated to relax the restriction on the arrangement of the housing box 21 so that the degree of freedom for the layout in combination with another device can be improved.

Moreover, the joint between the box body 26 and the upper cover member 27 is provided with ridge and groove portions to mesh with each other, as shown in FIGS. 8A and 8B. In the bottom of the groove, there is fixed a seal member 43.

At the upward open end of the box body 26, more specifically, there is formed a ridge 41 which is protruded by a predetermined height upward along the wall face from the central portion of the wall in the thickness direction, along the peripheral open edge. The ridge 41 is angled in a transverse section at its leading end side. On the other hand, the downward open end of the upper cover member 27 is thickened outward, and a groove 42 slightly deeper than the protruded height of the ridge 41 is formed for the ridge 41 generally at the central portion of the wall and along the peripheral open edge. The groove 42 is formed to have a rectangular transverse section on its bottom side.

On the bottom portion of the groove 42, there is mounted the seal member 43 which can be elastically deformed when it is pushed by the leading end of the ridge 41.

Specifically, this seal member 43 is formed to have an angled transverse section and is placed all over the periphery of the groove 42. Moreover, the seal member 43 is made of a material such as foamed rubber having a sufficient elasticity and a water-proof.

Thus, the joint portion between the box body 26 and the upper cover member 27 is provided with the ridge 41 and the groove 42 having the seal member 43, and the box body 26 and the upper cover member 27 are fitted at the joint portion. After the housing box body 26 and the upper cover member 27 were thus assembled, the seal member 43 of the groove 42 is softly deformed into a shape along the leading end of the ridge 41 to come into close contact with the ridge 41 so that no clearance is left at that joint portion. Moreover, a plurality of steps are formed in the passage which might otherwise admit water or dust from the outside to block passage of the water or dust so that a sufficient sealing performance can be retained as the housing box 21 at the joint portion between the box body 26 and the upper cover member 27.

Moreover, the seal member 43 is mounted in the bottom portion of the groove 42 so that it is positioned deep in the groove 42 and is protected while being not exposed to the outside. Therefore, the seal member 43 itself can be prevented from being damaged, to keep its sealing performance, and a softer fragile material can be used for the seal member 43. The option range for the material can be widened to lower the cost and raise the performance.

Moreover, a groove is formed at the joint portion of the upper cover member 27 to the box body 26, i.e., the groove 42 is formed downward, so that it can be freed from accumulation of fine dust and from being clogged with the dust.

At the same time, a ridge is formed at the joint portion of the box body 26 to the upper cover member 27, i.e., the ridge 41 is formed upward, so that it can be freed from accumulation of fine dust and from being contaminated with the dust.

As a result, even if the upper cover member 27 is repeatedly mounted on and demounted from the box body 26 so as to inspect and maintain the electronic unit 23, the joint portion between the upper cover member 27 and the box body 26 is hardly clogged wit the fine dust. Therefore, the joint portion can retain the sealing property to keep the sealing performance as the housing box 21.

Here will be described another specific embodiment of the housing box 21 of the invention.

This specific embodiment will be described mainly on the construction of the cooling panel as on the remaining specific embodiment to be described hereinafter.

Figure 9A:
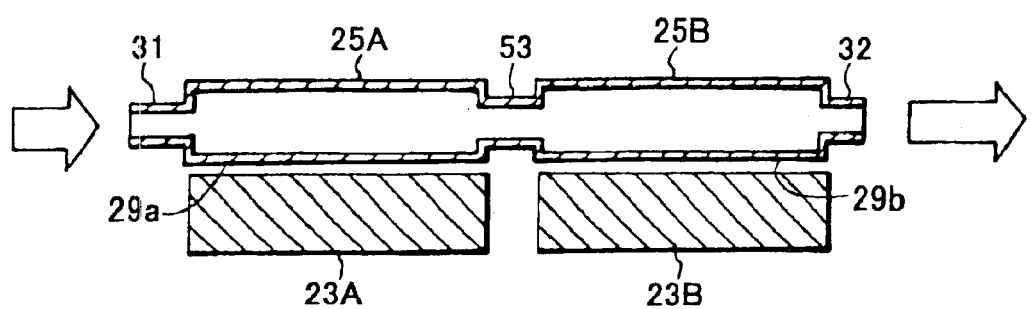
FIG. 9A is a longitudinal section schematically showing a construction of still another specific embodiment of the invention, in which cooling panels are connected in tandem.

As shown in FIG. 9A, the housing box 21 of this embodiment is constructed such that a cooling panel 25A and a cooling panel 25B are arranged horizontally in tandem and such that two or more electronic units 23A and 23B to be cooled by the cooling panels 25A and 25B, respectively, are housed in the housing box 21.

Moreover, the inlet 31 is formed in the side face of one cooling panel 25A, and the outlet 32 is formed in the side face of the other cooling panel 25B. These cooling panels 25A and 25B are internally made to communicate with each other via a communication passage 53 interposed inbetween.

In the insides of the individual cooling panels 25A and 25B, there are defined and formed passages for circulating at least through all the portions having received the heats from the electronic units 23A and 23B. It is also assumed that the remaining specific embodiments to be described have similar passages defined and formed in the cooling panels.

In addition to effects similar to those of the foregoing specific embodiment, therefore, according to the construction of this embodiment, when the two or more electronic units 23A and 23B are housed in the housing box 21, those upper faces of the electronic units 23A and 23B which have the largest surface areas for concentrating the heats easily are confronted or contacted by heat receiving faces 29a and 29b or the bottom faces of the cooling panels 25A and 25B, as in the foregoing embodiment. Therefore, the heats of the electronic units 23A and 23B are efficiently transferred to the cooling panels 25A and 25B so that the electronic units 23A and 23B can be effectively cooled down with the cooling air thereby to acquire high cooling capacities. As a result, the cooling panels need not be arranged on the remaining faces of the electronic units 23A and 23B, i.e., around the electronic units 23A and 23B so that the housing box 21 can be made compact.

Especially, the housing box 21 can be constructed to have the minimum necessary height, as in the foregoing specific embodiment. Specifically, the height of the housing box 21 can be made slightly larger than the sum of the height of the higher one of the electronic units 23A and 23B and the height of the higher one of the cooling panels 25A and 25B which are specified by the internal volumes set according to the calorific powers of the electronic units 23A and 23B confronted or contacted. As a result, according to the housing box 21 having such height, the drop in the ventilation in the engine room by the housing box 21 can be reduced to provide a sufficient engine cooling efficiency so that the capacity of the engine can be fully exhibited to improve the drivability of the vehicle.

All the way from the inlet 31 to the outlet 32, moreover, the cooling air always flows in substantially identical planes, and its flow direction fluctuates not vertically but only transversely. Therefore, the cooling air passing through the individual cooling panels 25A and 25B is not affected by the vertical fluctuations so that its flow rate can be easily set to an intended value.

Here will be described another specific embodiment of the housing box 21 of the invention.

Figure 9B:
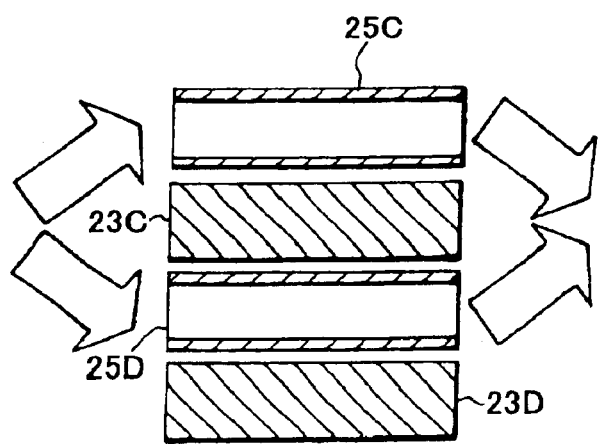
FIG. 9B is a longitudinal section schematically showing a construction, in which cooling panels are connected in parallel.

As shown in FIG. 9B, the housing box 21 of this embodiment is constructed by arranging a cooling panel 25C and a cooling panel 25D vertically in stack and in parallel with each other and by housing at least two or more electronic units 23C and 23D to be cooled by the cooling panels 25C and 25D, in the housing box 21.

Specifically, the cooling panels 25C and 25D stacked are provided on their one-side faces with the (not-shown) inlet and (not-shown) branch passages communicating with the inlet and branching into the cooling panels 25C and 25D, so that the cooling air introduced from the inlet may be distributed into the cooling panels 25C and 25D.

On the other hand, the cooling panels 25C and 25D are provided on their other side faces with the (not-shown) outlet and (not-shown) collecting passages communicating with the outlet and collecting from the cooling panels 25C and 25D, so that the cooling air flows collected and discharged from the cooling panels 25C and 25D may be discharged from the outlet.

In addition to effects similar to those of the aforementioned specific embodiment, therefore, according to the construction of this embodiment, the cooling air introduced from the inlet is distributed into the cooling panels 25C and 25D so that these cooling panels 25C and 25D can exhibit their cooling abilities without any interference and independently of each other. The electronic units 23C and 23D corresponding to the cooling panels 25C and 25D are likewise cooled without being affected by each other so that the cooling performances can be stably retained. Even if the cooling ability of one cooling panel is lowered for some reason, the cooling ability of the other can be kept unlowered, so that the trouble-resistance can be retained to improve the cooling performance.

Depending upon the passages to be defined and formed in the cooling panels 25C and 25D, moreover, the lengths of the passages from the inlet to the outlet can be equalized between the cooling panel 25C and the cooling panel 25D thereby to set the cooling abilities of the cooling panels 25C and 25D identical to each other. Therefore, the plurality of electronic units 23C and 23D requiring substantially identical cooling abilities can be easily handled by housing them in the housing box 21.

In the construction in which the two electronic units 23C and 23D are cooled by the two cooling panels 25C and 25D, moreover, the lengths of the passages need not be doubled but can be substantially set to that of the single cooling panel. In this modification, the passage resistance to the feed pressure of the cooling air by the length of the passage, that is, the pressure loss can be reduced. By raising the feed pressure of the cooling air, therefor e, the flow rates in the cooling panels 25C and 25D can be efficiently increased to enhance the cooling abilities by the increase in the flow rate.

By the construction in which the cooling panels 25C and 25D and the electronic units 23C and 23D are stacked, moreover, the plane area for mounting them is not increased but only is one necessary for arranging a single set of an electronic unit and a cooling panel. Therefore, it is possible to relax the conditions for arranging the housing box 21.

In the foregoing specific embodiments, that of the faces of the electronic unit 23A or 23B which has the largest surface area is directed upward to provide the upper face, and this upper face is confronted at a clearance or contacted by the bottom face of the cooling panel 25A or 25B. However, the construction should not be limited thereto but may be modified such that the hottest face of the electronic unit 23A or 23B may be positioned as the upper face in accordance with the application or function of the electronic unit 23A or 23B.

According to this construction, therefore, the operating heat is continuously carried away by the cooling air from that of the faces of the electronic unit 23A or 23B which is liable to take the higher temperature and to concentrate the heat. Therefore, the electronic unit 23A or 23B can be efficiently cooled to retain the sufficient cooling performance.

Of the faces of the electronic unit 23A or 23B, moreover, there may be selected: the face to which the operating heat of an important part indispensable for the application or function is transferred; the face confronted by the region which has a high operating frequency so that it comes into a high temperature state locally; or the face confronted by the part which is isolated either to prevent it from exerting the influences of its high operating beat upon other electronic parts or to prevent it from being thermally influenced by other electronic parts because of its strict temperature conditions at the operating time. Thus, it is possible to eliminate the disadvantages of each of those cases in advance.

Moreover, the upper face of the electronic unit 23A or 23B is confronted at a clearance or contacted by the bottom face of the cooling panel 25A or 25B. However, the construction should not be limited thereto but may be modified such that the passage or passages confronted by one or some of the side faces of the electronic unit 23A or 23B excepting that upper face are retained by extending members constructing the cooling panel 25A or 25B. Especially if the passage of the cooling air is retained at that face of the housing box 21 which is easily heated from the outside, the influence of the heat from the outside on the electronic unit 23A or 23B can be reduced. Even if the electronic unit 23A or 23B is not cooled, therefore, it is sufficiently effective to cool down the electronic unit 23A or 23B.

According to the housing box thus constructed, as has been described hereinbefore, the cooling panels for passing the cooling air therethrough are housed in the housing box, and the electronic units and the cooling panels are thermally shielded from the outside. Even if a large space for passing the cooling air therethrough is not retained around the electronic units, therefore, the electronic units can be sufficiently cooled down by the cooling panels, and the cooling panels themselves can be made small to make the housing box compact.

With the construction in which the cooling panels confront the upper faces of the electronic units, moreover, the heat can be continuously carried away from the upper face, in which the operating heat is easily concentrated by the natural convection in the cooling panel, by the cooling air flowing in the electronic unit. Therefore, a high cooling efficiency can be obtained to retain a sufficient cooling performance. Especially, one of the faces of the electronic unit, the face having the largest surface area is directed upward as the upper face. Therefore, most of the operating heat generated by the electronic unit is efficiently transferred from the electronic unit to the cooling panel so that the cooling ability of the electronic unit can be improved. As a result, a high cooling ability can be obtained so that the cooling panel can be made smaller to make the size of the housing box itself smaller.

When the housing box is disposed in the engine room, on the other hand, the housing box is small-sized so that it is freed from interfering with other parts around it. Therefore, the parts can be easily assembled. Moreover, the cooling efficiency of the engine can be kept without lowering the ventilation of the vehicle compartment so that the performance of the engine can be sufficiently exhibited to improve the drivability of the vehicle.

Moreover, the inlet and the outlet are protruded from the side face of the cooling panel close to and in parallel with each other so that the conduits to be connected to those inlet and outlet can be gathered substantially at a position. Therefore, the conduits can be improved in their mountability and prevented from interfering with the wires to be connected with the electronic unit and the structures around them, thereby to improve the degree of freedom for the design.

Moreover, the single opening is formed so that the inlet and the outlet of the cooling panel arranged close to each other may be extended to the outside of the housing box and may pass through the wall portion of the housing box. As compared with the construction having the two separate openings for the inlet and the outlet, the single opening can be sufficiently formed in the housing box to reduce the working cost and to improve the sealing property and the structural strength of the housing box.

Moreover, the seal member is mounted in advance midway of the extensions of the inlet and the outlet so that it can be interposed between the inlet and the outlet and the opening of the housing box can be sealed without any clearance, merely by assembling the cooling panel having the electronic unit with the outer box body and by assembling the outer box cover with the outer box body. At this assembling time, the seal members for the inlet and the outlet need not be separately assembled to improve the assemblability, and the single seal member can reduce the number of parts.

Moreover, the inside of the cooling panel is partitioned to form the passage arbitrarily in the cooling panel so that the positions for forming the inlet and the outlet in the cooling panel are not restricted. Therefore, the arrangements for the inlet and outlet themselves and the fee d/exhaust ducts to be connected to the inlet/outlet can be flexibly altered according to the other surrounding parts or structures thereby to improve the mountability of the ducts. Moreover, the ducts can be prevented from interfering with the wires to be connected with the electronic unit or the other surrounding parts or structures.

By fitting the box body of the housing box and the cooing panel at their joint portion between the ridge and the groove and by arranging the seal member in the groove, moreover, the seal member in the groove is elastically deformed into close contact with the ridge after the box body and the cooling panel were assembled. Therefore, no clearance is left at the joint portion, and the plurality of steps are formed by the groove-ridge fitting relation in the passage which might otherwise allow the moisture or dust to penetrate from the outside into housing box through the joint portion. Thus, the penetration of the moisture or dust can be blocked to retain the sealing property as the housing box sufficiently.

On the other hand, the joint portion of the upper cover member for the box body is provided with the downward groove so that the groove can be prevented from being clogged with the fine dust. Moreover, the joint portion of the box body for the upper cover member is provided with the upward ridge so that the ridge can be less contaminated with the fine dust. As a result, even if the upper cover member is repeatedly mounted on or demounted from the box body so as to inspect or maintain the electronic unit, the sealing property at the joint portion between the upper cover member and the box body can be retained to keep the sealing performance as the housing box.

Figure 10:
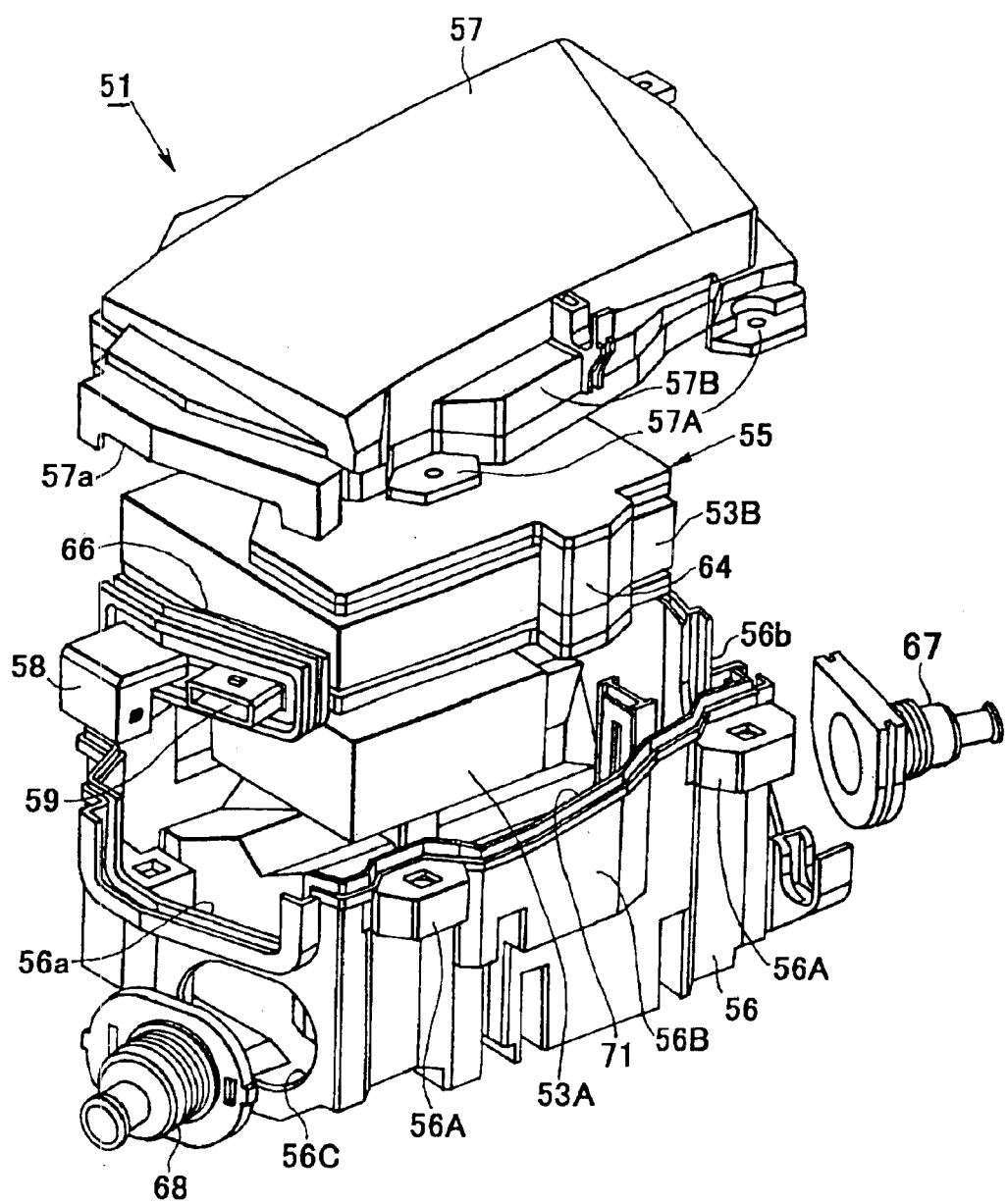
FIG. 10 is an exploded perspective view showing an essential portion of the entire construction of a further specific embodiment of the invention.
Figure 11:
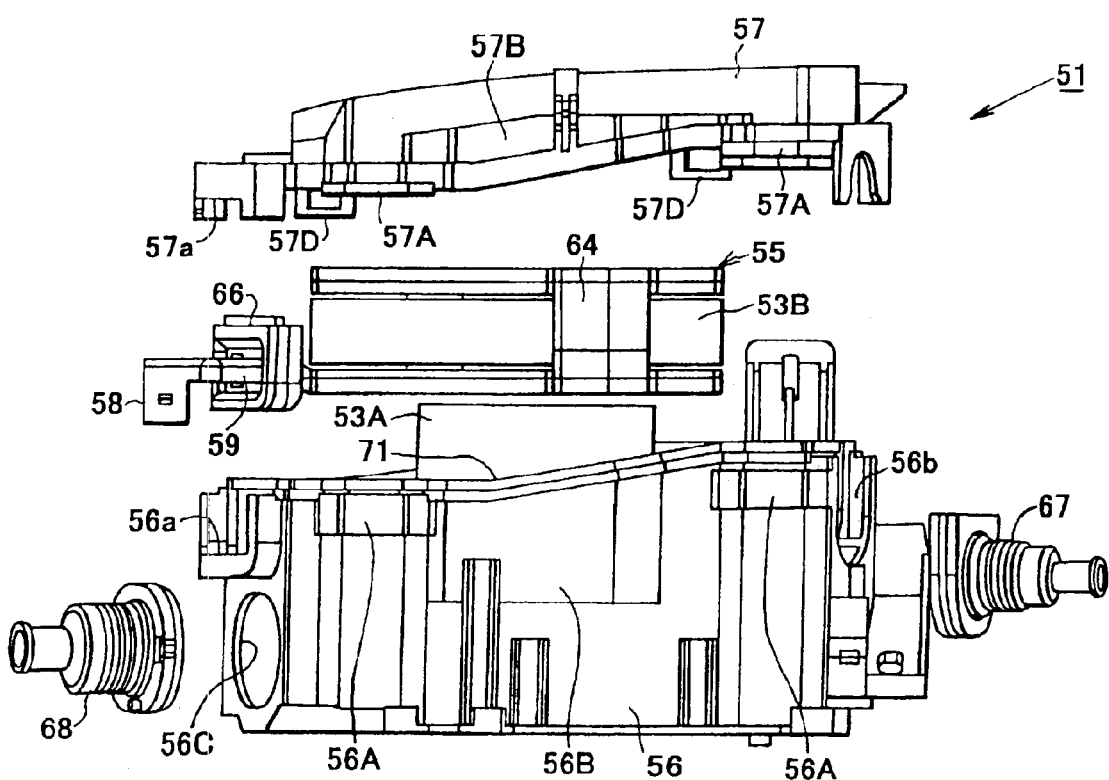
FIG. 11 is a front elevation showing the state in which the specific embodiment is disassembled.
Figure 12:
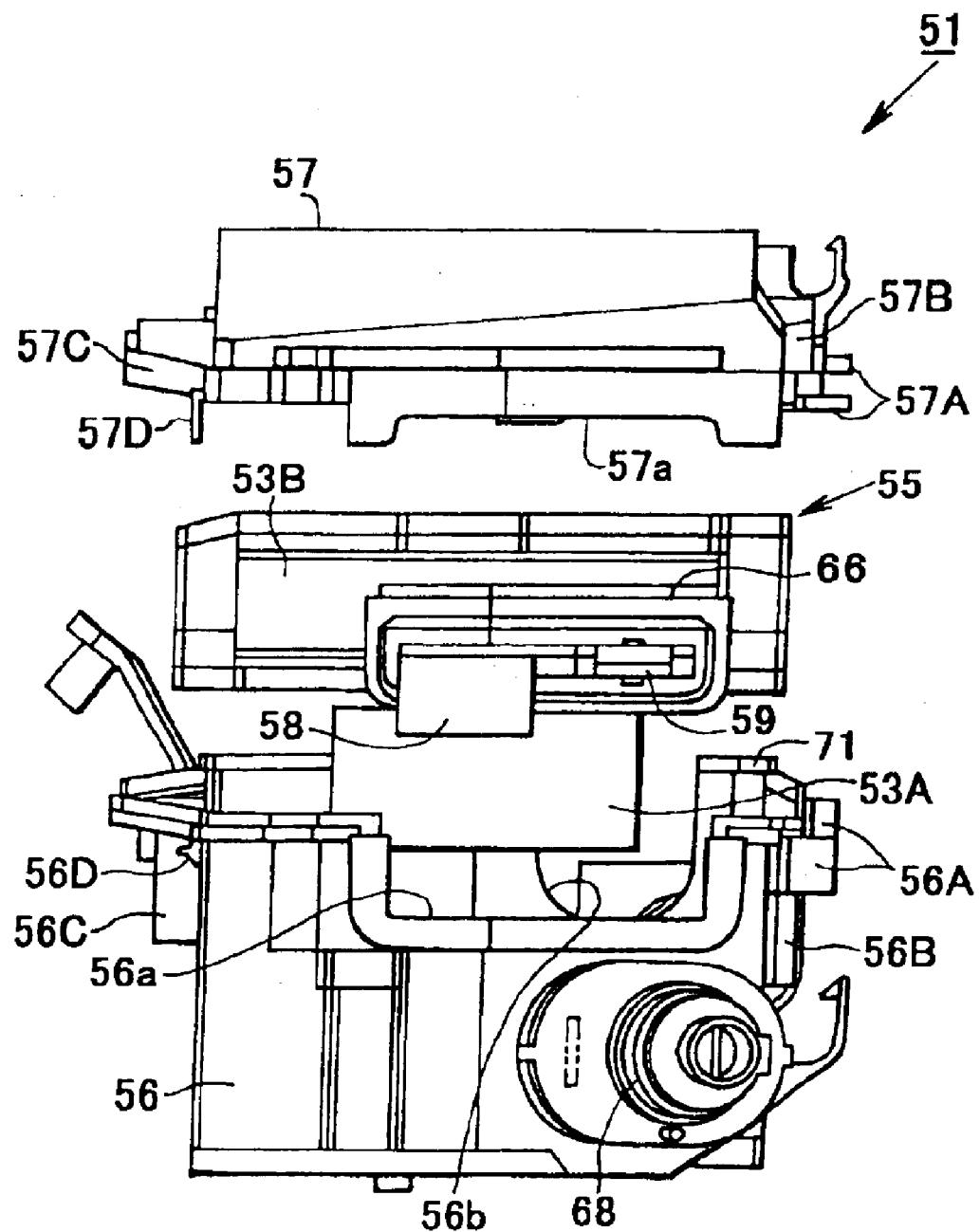
FIG. 12 is a lefthand side elevation showing the state in which the specific embodiment is disassembled.
Figure 13:
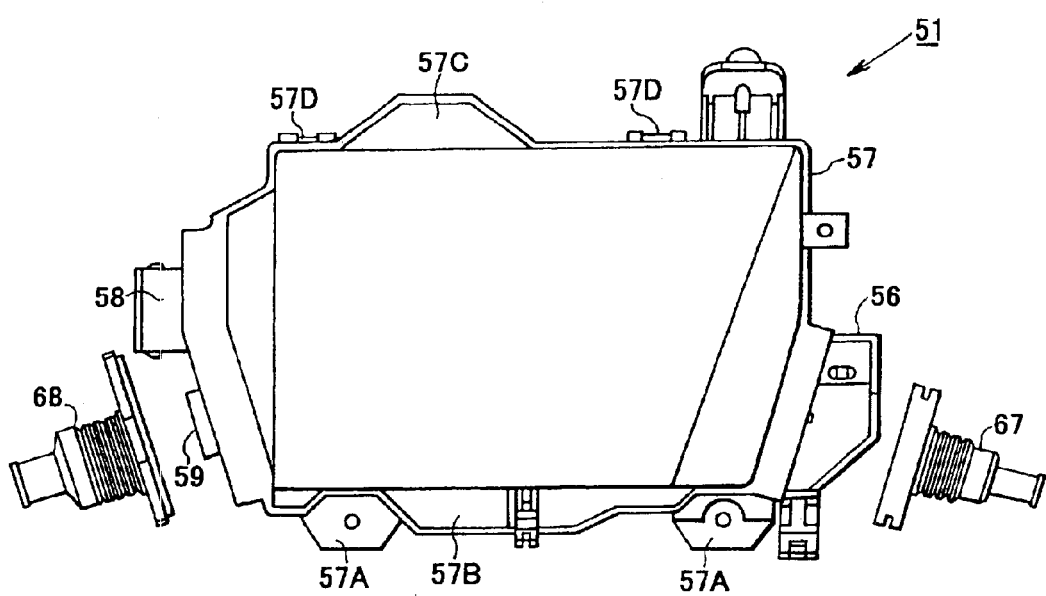
FIG. 13 is a top plan view showing the specific embodiment.

Here will be described still another specific embodiment of the invention. The embodiment to be described in the following is constructed, as shown in FIG. 10, such that two electronic units 53A and 53B having electronic devices of electronic parts in a case are housed in a housing box 51 having water-proof, dust-proof and heat-resisting functions. The fundamental constructions of the electronic units 53A and 53B are substantially identical to those of the electronic units of the foregoing specific embodiments. However, the individual electronic units 53A and 53B are different from each other in their contours because of the constructions of the electronic parts housed therein. The electronic unit 53A is formed into a parallelepiped shape whereas the electronic unit 53B is formed into a flat plate shape.

The housing box 51 is constructed to include: a cooling panel 55 on which the electronic units 53A and 53B are removably mounted; an outer box body 56 for housing the cooling panel 55 therein; and an outer box cover 57. Conduits can be connected to the cooling panel 55, and wires can be connected with the electronic units 53A and 53B.

The cooling panel 55 is made of a synthetic resin material having an excellent heat conductivity and is constructed, as shown in FIG. 14, FIGS. 15A to 15C and FIGS. 16A and 16B, by arranging two flat plate shape hollow bodies 61 and 62 with their upper and lower faces being in parallel with each other and at a predetermined clearance, by connecting and fixing those two hollow bodies 61 and 62 through two communication passages 63 and 64, and by forming an inlet 58 and an outlet 59 for the cooling wind in one hollow body 61.

Specifically, the hollow body 61, as located on the lower side of the Drawings, is planarly formed into a generally rectangular shape identical to the planar shape of the electronic unit 53B and is provided in its side face with the cooling wind inlet 58 and outlet 59 juxtaposed to each other.

Moreover, the bottom face of the hollow body 61 on the lower side is contacted in a heat transferable manner by the upper face of the electronic unit 53A. Therefore, the bottom face of the hollow body 61 provides a first heat receiving face 61A.

Figure 16A:
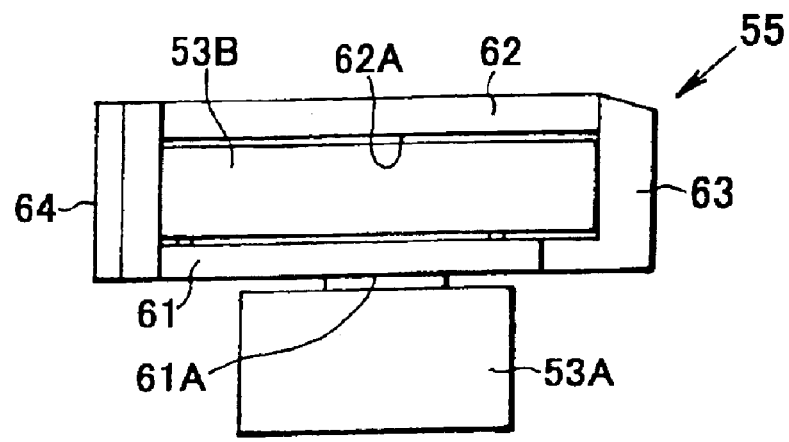
FIG. 16A is a righthand side elevation showing the cooling panel, on which the electronic units are mounted, of the specific embodiment.
Figure 16B:
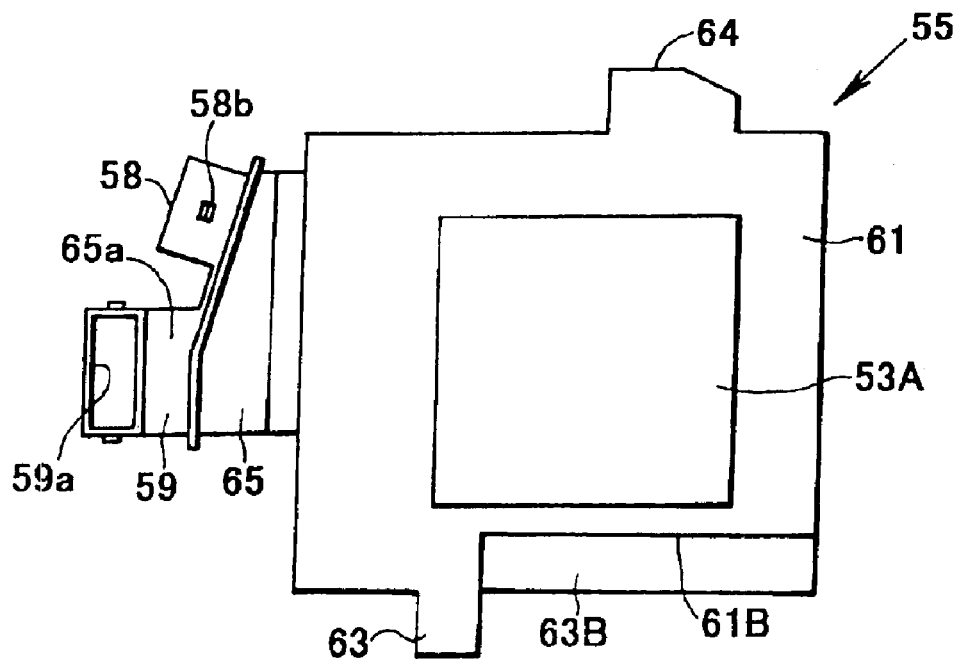
FIG. 16B is a bottom view of the same.

Here, reference numeral 61B appearing in FIG. 16B designates a notch which is formed in the hollow body 61 for retaining a predetermined clearance in the housing box 51 when the cooling panel 55 is housed in the housing box 51.

The hollow body 62 on the upper side is planarly formed into a generally rectangular shape identical to the planar shape of the electronic unit 53B.

Between the upper hollow body 62 and the lower hollow body 61 contacted by the electronic unit 53A, as shown in FIG. 14, FIGS. 15A to 15C and FIGS. 16A and 16B, there is sandwiched and fixed the electronic unit 53B which generates heat when activated. Moreover, this electronic unit 53B is contacted at its upper face in a heat transferable manner by the lower face of the upper hollow body 62. Therefore, the lower face of the upper hollow body 62 provides a second heat receiving face 62A.

Here, reference numeral 62B designates a notch which is formed in the hollow body 62 for retaining a predetermined clearance in the housing box 51 when the cooling panel 55 is housed in the housing box 51.

Moreover, the two communication passages 63 and 64 for connecting the upper and lower hollow bodies 61 and 62 are formed to bypass the space formed between the two hollow bodies 61 and 62.

Specifically, these communication passages 63 and 64 are formed into hollow column shapes and are vertically arranged on the outer sides of the portions of the longer sides, as viewed in a top plan view, of the hollow bodies 61 and 62 and at staggered positions of the opposite sides.

Therefore, those communication passages 63 and 64 are formed to avoid the interference with the harnesses to be connected with the electronic units 53A and 53B and to retain clearances for mounting brackets to fix the outer box cover 57 on the outer box body 56.

Moreover, the communication passages 63 and 64 are connected to communicate with the passages formed in the later-described hollow bodies 61 and 62. Specifically, one communication passage 63 is connected with an entrance passage formed in the hollow body thereby to feed the cooling air having passed through the entrance passage to the inside of the upper hollow body 62. The other communication passage 64 is connected with the terminal end of a passage formed in the upper hollow body 62 thereby to feed the cooling air having passed through the passage to an exit passage formed in the lower hollow body 61.

Moreover, the effective area of the communication passage 64 for feeding the cooling air from the upper hollow body 62 is made slightly larger than that of the communication passage 63 for feeding the cooling air from the lower hollow body 61, so that the cooling air having its volume expanded by the operating heats of the two electronic units 53A and 53B may be smoothly fed from the upper hollow body 62 to the lower hollow body 61.

Moreover, the lower hollow body 61 is integrally provided with the inlet 58 and the outlet 59 on the shorter side face, as viewed in the top plan. Specifically, an extension 65 for the inlet 58 and the outlet 59 is formed to have a thickness equal to that of the lower hollow body 61 by protruding it by a predetermined length from the side face of the hollow body 61. Therefore, these inlet 58 and outlet 59 are protruded outward by the predetermined length at the housing time from the housing box 51 composed of the outer box body 56 and the outer box cover 57.

Figure 17:
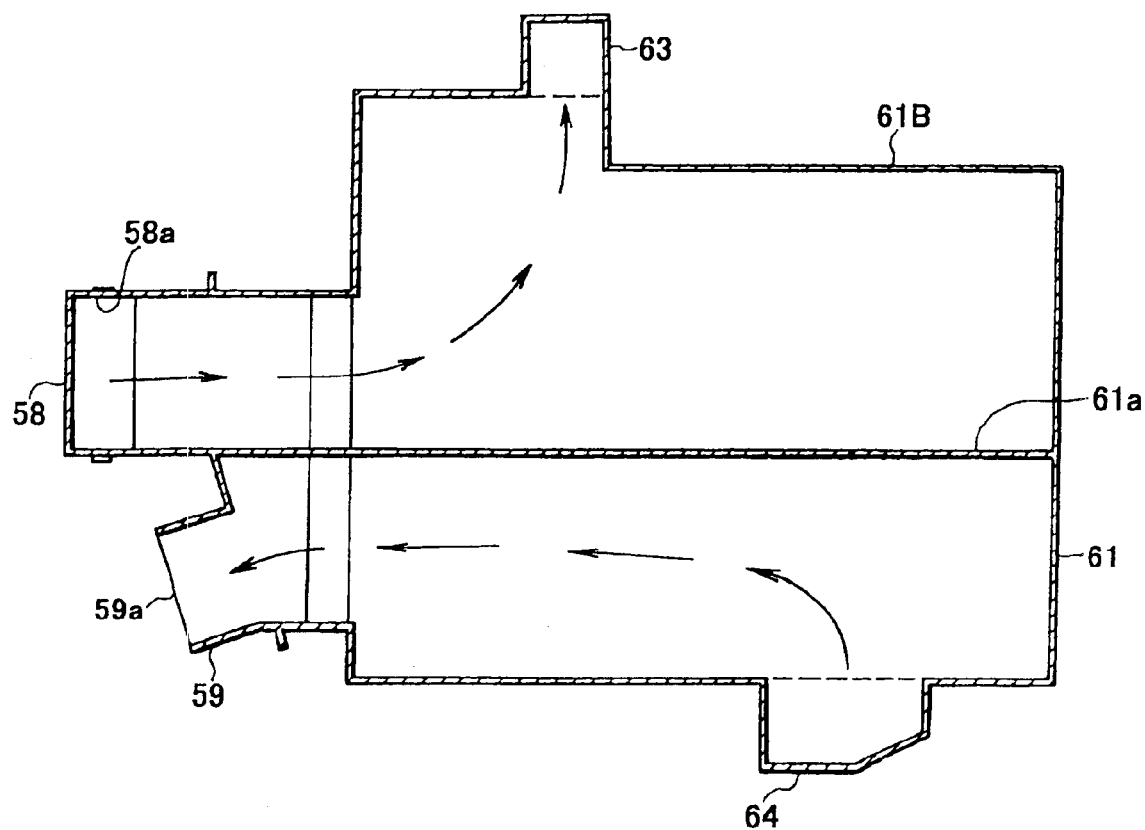
FIG. 17 is a sectional top plan view showing the flow of cooling air in a lower hollow body in the cooling panel of the specific embodiment.

Moreover, the extension 65 is transversely divided from the center along its extending direction, as shown in FIG. 17, and is provided with a partition 61a for dividing the inside of the hollow body into two chambers thereby to form passages communicating with the inlet 58 and the outlet 59 and continued to communicate as they are with the two chambers in the hollow body.

Figure 14:
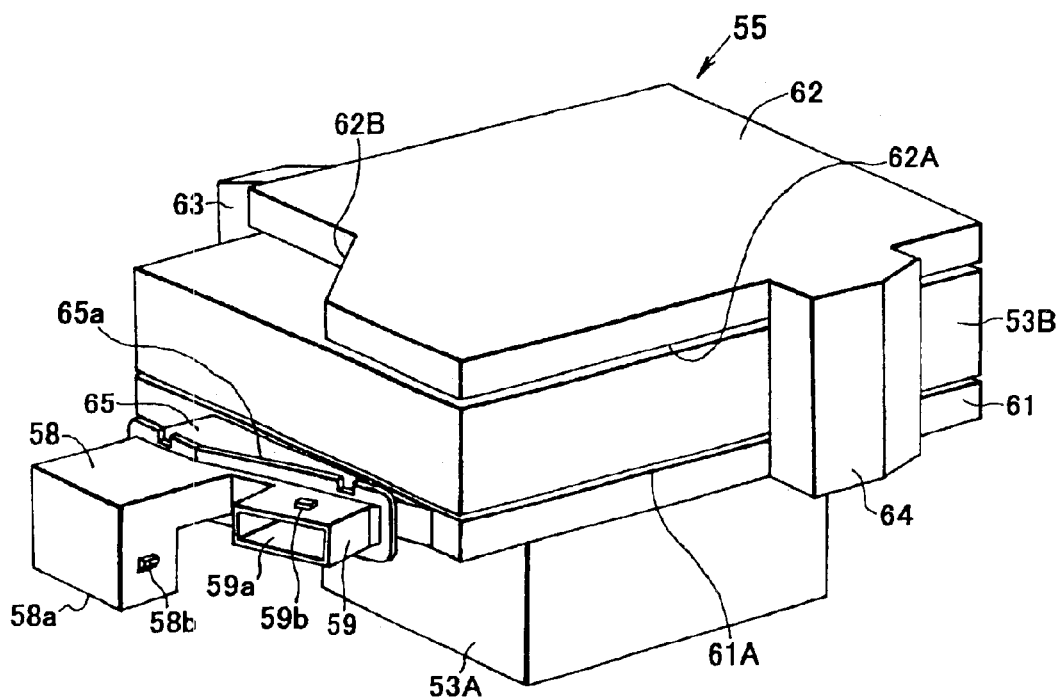
FIG. 14 is a perspective view showing the entire construction of a cooling panel, on which electronic units are mounted, of the specific embodiment.
Figure 15A:
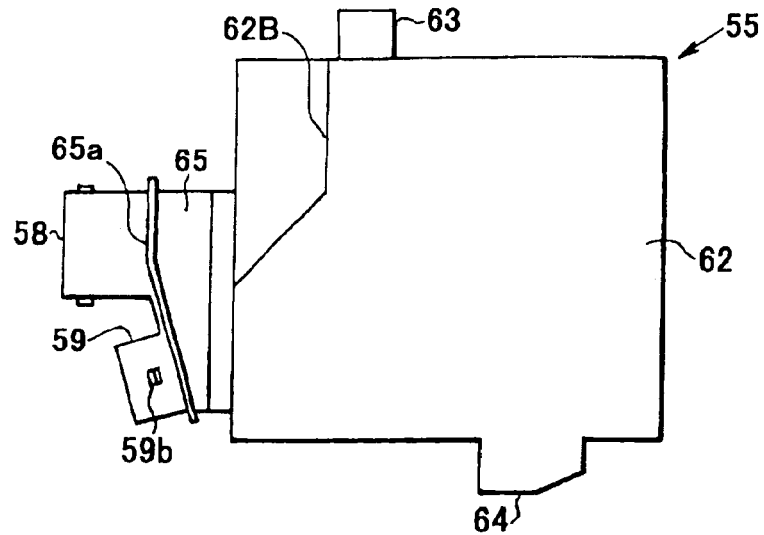
FIG. 15A is a top plan view of the cooling panel, on which the electronic units are mounted, of the specific embodiment.
Figure 15B:
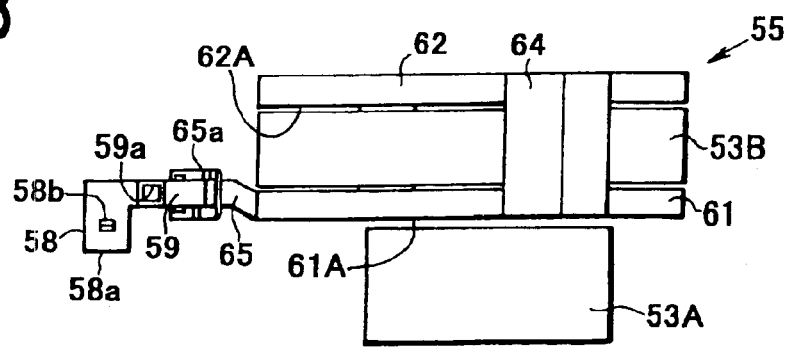
FIG. 15B is a front elevation of the same.
Figure 15C:
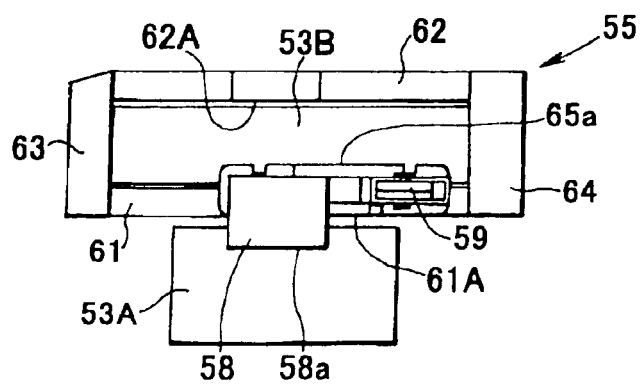
FIG. 15C is a lefthand side elevation of the same.

Reverting to FIGS. 14 and 15, moreover, the inlet 58 and the outlet 59 are vertically bent midway of their extension 65 while keeping their extending directions identical.

Moreover, the outlet 59 has its port 59a directed in the extending direction, whereas the inlet 58 is bent near its leading end to have its port 58a directed downward of the Drawing.

Therefore, the ports 58a and 59a of the inlet 58 and the outlet 59 are directed in directions different from each other. When the (not-shown) dedicated ducts for feeding or discharging the cooling air are to be individually connected to the inlet 58 and the outlet 59, therefore, they may be connected in the different directions. Thus, the duct mountability and demountability can be sufficiently retained.

To the inlet 58, more specifically, there is connected the (not-shown) pipe-shaped suction duct for feeding the ambient air to the cooling panel 55. To the outlet 59, there is connected the (not-shown) pipe-shaped exhaust duct for discharging the ambient air fed from the cooling panel 55.

Moreover, the leading end of the suction duct to be connected to the inlet 58 is arranged in the lower portion of the vehicle body at the forward leading end of the vehicle so that it can suck the ambient air. This suction duct is so bent that its intermediate portion may extend along the inner shape of the engine room or around the other devices or conduits. The other end of the suction duct is connected to the inlet 58 of the cooling panel 55 so that the suction duct may communicate with the cooling panel 55. Therefore, the ambient air is sucked from the one end of the suction duct at a lower position and is fed to the cooling panel 55 of the housing box 51, arranged in the upper portion on the contrary. At the same time, the suction duct is bent at its intermediate portion so that an amount of moisture or dust may be prevented from being sucked into the cooling panel 55 when the ambient air is let in.

On the other hand, the terminal end of the exhaust duct to be connected to the outlet 59 is arranged at a position near the suction side of the (not-shown) motor-driven fan which is disposed in the (not-shown) radiator unit in the engine room.

As the fan in the radiator unit rotates, therefore, a vacuum is established to suck the ambient air from the suction duct. This ambient air sucked is discharged through the cooling panel 55 of the housing box 51 from one end portion of the exhaust duct to the radiator unit.

Moreover, reference numerals 58b and 59b designate projections which are used when the dedicated ducts for feeding/exhausting the cooling air are connected to the inlet 58 and the outlet 59, respectively.

Moreover, the extension 65 of the inlet 58 and the outlet 59 is provided at its predetermined portion with a rib 65a for mounting a seal member 66 on the inlet 58 and the outlet 59. Specifically, this rib 65a is disposed to confront the outer wall of the housing box 51, when the cooling panel 55 is housed in the housing box 51, and is formed to protrude in a flange shape by a predetermined amount around the extrusion 65.

The seal member 66 to be mounted on the rib 65a is made of an elastically deformable material and is formed at its inner peripheral edge portion into a shape slightly smaller than the outer peripheral shape of the rib 65a and at its outer peripheral edge portion into a shape generally identical to the inner peripheral shape of the opening which is formed by a notch 56a of the outer box body 56 and a notch 57a of the outer box cover 57, as will be described later, when the outer box cover 57 is assembled with the outer box body 56.

Therefore, the inlet 58 and the outlet 59 are sealed up without any clearance by sandwiching the seal member 66 between them and the opening of the housing box 51 when the outer box cover 57 is assembled with the outer box body 56.

In the upper hollow body 62, moreover, there is formed a cooling air passage of a predetermined sealed structure so as to improve the heat exchange efficiency between the hollow body 62 and the electronic unit 53B.

Figure 18A:
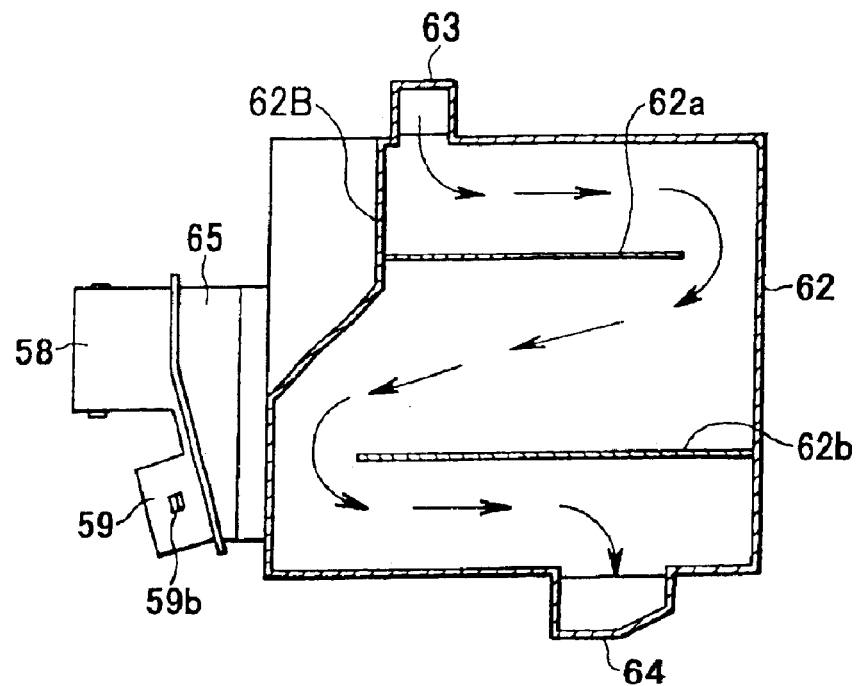
FIG. 18A is a sectional top plan view showing the flow of cooling air of the case in which the upper hollow body of the cooling unit of the specific embodiment is provided with a partition.

As shown in FIG. 18A, more specifically, the inside of the upper hollow body 62 is partitioned by staggered partitions 62a and 62b. This upper hollow body 62 is provided with the partition 62a, which is formed from the side wall near the communication passage 63 connected to the hollow body 62 to the vicinity of the opposite side wall, and the partition 62b which is formed from the other side wall to the vicinity of the opposite side wall. A meandering passage from the communication passage 63 to the communication passage 64 is defined and formed in the hollow body 62 by those partitions 62a and 62b.

Figure 18B:
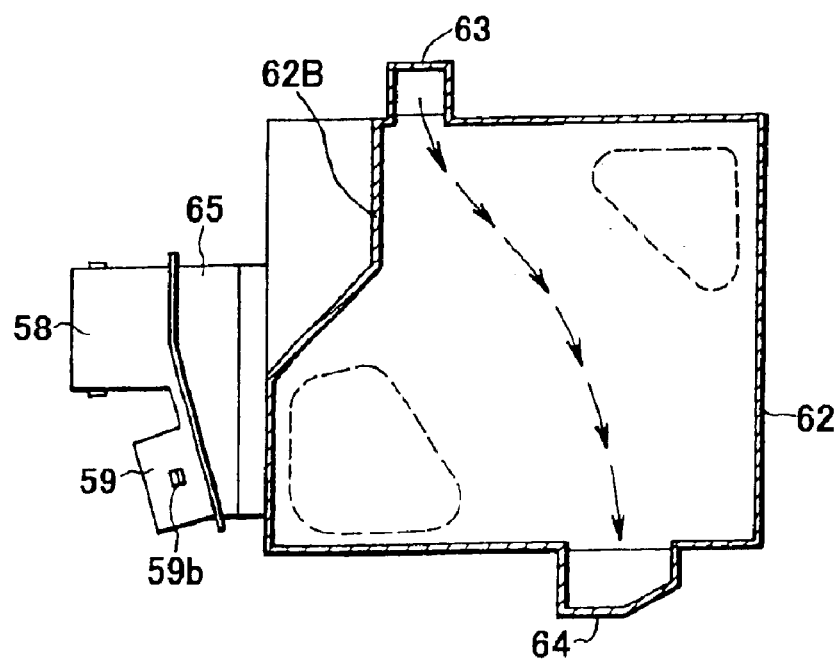
FIG. 18B is a sectional top plan view showing the flow of cooling air of the case having no partition.

Therefore, the cooling air fed from one communication passage 63 passes substantially the whole area in the upper hollow body 62 to the other communication passage 64 while meandering along the passage. As a result, the cooling wind always flows substantially all over the area in the hollow body 62 so that the heat can always be carried away from the substantially whole area of the hollow body 62 thereby to improve the ability to cool the electronic unit 53B. In the case failing to have such passage, on the contrary, the regions enclosed by broken lines in FIG. 18B become the hot zones in which the operating heat transferred from the electronic unit 53B resides.

Figure 19:
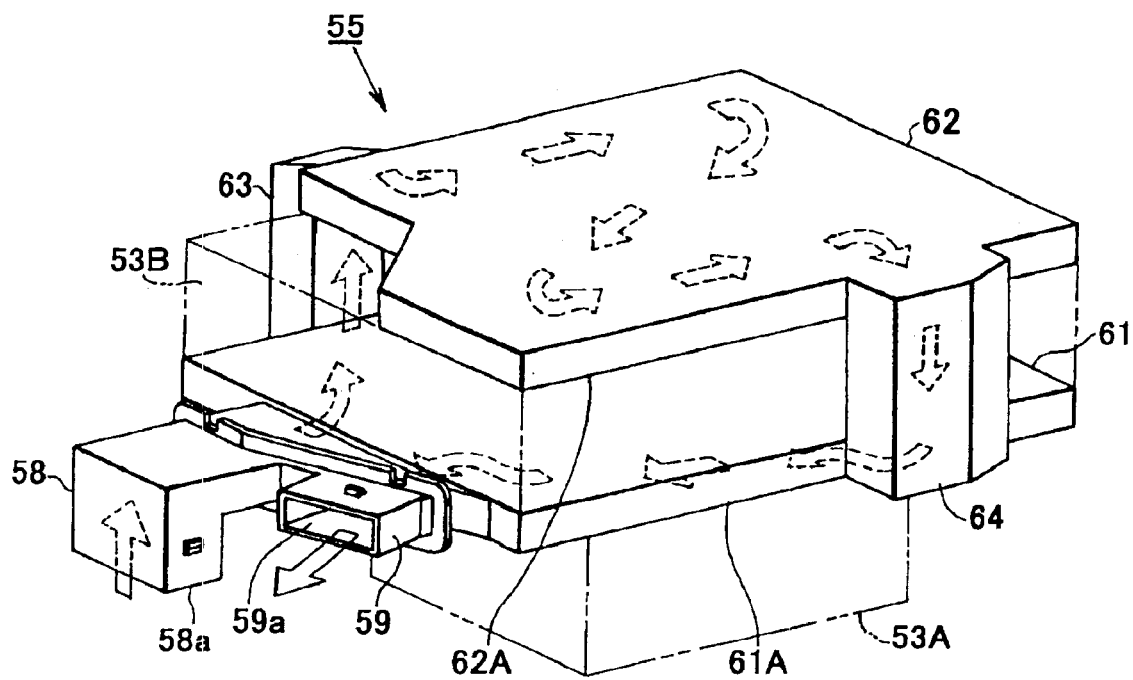
FIG. 19 is a perspective view schematically showing the flow of cooling air in the cooling panel of the specific embodiment.

In the cooling panel 55 shown in FIG. 19, the upper face of the electronic unit 53A is contacted by the first heat receiving face 61A of the hollow body 61, and the electronic unit 53B is contacted by the second heat receiving face 62A of the hollow body 62. The operating heats generated by the actions of those electronic units 53A and 53B are transferred to the heat receiving faces 61A and 61B, respectively. On the other hand, the ambient air or the cooling air is fed from the inlet 58. This cooling air flows at first in the lower hollow body 61 to carry away the heat from the lower face of the hollow body 61, i.e., from the first heat receiving face 61A. As a result, the electronic unit 53A is indirectly air-cooled. In this case, the electronic unit 53A is efficiently cooled because the heat is carried out by the natural convection from the upper face in which the operating heat is easily concentrated.

Moreover, the cooling air having acquired the heat of the electronic unit 53A to have its temperature raised to some extent is fed via the communication passage 63 to the upper hollow body 62 and flows toward the other communication passage 64 while meandering in the upper hollow body 62. In the way of this communication, the cooling air is contacted by the lower face of the upper hollow body 62, i.e., the second heat receiving face 62A so that it carries away the heat. As a result, the electronic unit 53B contacted by the second heat receiving face 62A is indirectly air-cooled. In this case, the electronic unit 53B has its heat carried away from its upper face, in which the operating heat is easily concentrated, by the natural convection so that it is efficiently cooled down.

Moreover, the cooling air is fed via the communication passage 64 to the lower hollow body 61 and carries again the heat away the first heat receiving face 61A to cool the electronic unit 53A indirectly, until it is discharged from the outlet 59.

Here, the electronic units 53A and 53B may be mounted on the cooling panel 55 by providing brackets of a metal or resin at predetermined positions of the cooling portion. Alternatively, optimum means can be suitably selected from lock members or a combination of bolts and nuts.

Thus, in the cooling panel 55 according to the invention, the cooling air flows only in the individual hollow bodies 61 and 62, i.e., only through the passages of the cooling air but does not come into direct contact with the electronic units 53A and 53B. Therefore, the electronic units 53A and 53B are not influenced or contaminated with the cooling air.

In the cooling panel 55 thus far described, moreover, the two electronic units 53A and 53B can be simultaneously cooled by carrying the heats away their upper faces so that they can be efficiently cooled down. Moreover, the electronic units 53A and 53B are vertically arranged at the predetermined clearance by stacking them so that the construction of the entire cooling panel 55 including the hollow bodies 61 and 62 can be made compact.

Then, the cooling air having received the operating heats of the two electronic units 53A and 53B flows via the communication passage into the lower hollow body 61 and is discharged from this hollow body 61 through the outlet 59 to the outside of the cooling unit.

Moreover, those inlet 58 and outlet 59 are gathered at one place. Therefore, as described hereinafter, only one opening is sufficient for passing the inlet 58 and the outlet 59 therethrough if it is formed in the housing box 51 which is composed of the outer box body 56 and the outer box cover 57. As a result, it is possible to improve the sealing property and the structural strength of the housing box 51.

Reverting to FIGS. 10 to 13, more specifically, the outer box body 56 is opened upward and is internally formed into a box shape similar to but slightly larger than the external shape of the cooling panel 55 having the electronic units 53A and 53B mounted thereon.

Moreover, this outer box body 56 is made of a synthetic resin having an excellent heat conductivity such as polypropylene or polyamide to lighten the weight and lower the cost and to retain the necessary heat resistance.

Moreover, that side face of the outer box body 56 which is confronted by the (not-shown) connector of the electronic unit 53B is provided with a semicircular notch 56b, on which there is mounted a grommet type seal member 67 for the (not-shown) wire harness to be connected with the connector.

Likewise in that side face of the outer box body 56 which is confronted by the (not-shown) connector of the electronic unit 53A, there is formed an elliptical opening 56c, on which there is mounted a grommet type seal member 68 for the (not-shown) wire harness to be connected with the connector.

Specifically, the wire harness seal members 67 and 68 are provided for sealing the wire harness and the notch 56b and the opening 56c with no clearance, so as to retain the sealing property with the outer box body 56 when the wire harness gathering the wires for connecting the electronic units 53A and 53B and the external devices electrically is connected the electronic unit 53A through the notch 56b and the opening 56c formed in the outer box body 56. Each of the seal members 67 and 68 is constructed to include a plate-shaped root portion to be fitted in the opening, and a pipe-shaped leading end portion jointed to the root portion. Via the cornice portion, these root portion and end portion are integrally formed of an elastically deformable material.

On the other hand, that side face of the outer box body 56 which is confronted by the inlet 58 and the outlet 59 is given such a length as is positioned slightly at a higher level than the lower hollow body 61 of the cooling panel 55 housed in the outer box body 56. Accordingly, the corresponding portion of the outer box cover 57 is extended downward.

Specifically, the notch 56a of a predetermined shape is formed in the side face of the outer box body 56, and the notch 57a of a predetermined shape is formed in the side face of the outer box cover 57. When the outer box cover 57 is assembled with the outer box body 56 there is formed a single opening which can pass the inlet 58 and the outlet 59. As has been described hereinbefore, a seal member corresponding to that opening is mounted on the predetermined portions of the inlet 58 and the outlet 59 of the cooling panel 55.

Merely by assembling the cooling panel 55 having the electronic units 53A and 53B in the outer box body 56 and by assembling the outer box cover 57 with the outer box body 56, therefore, the seal member 66 can be sandwiched between the inlet 58 and the outlet 59 and the opening the housing box 51 to seal them up with no clearance.

At the assembling time, therefore, the seal member for the inlet and the outlet need not be separately assembled to improve the assemblability.

Here, reference numeral 56A designates brackets which are disposed on one side portion of the outer box body 56 and in which screw holes of a predetermined diameter are formed therethrough. On the outer box cover 57, there are mounted bracket portions 57A which are located at positions corresponding to the bracket portions 56A. Moreover, the outer box cover 57 is provided on its other side portion with ring-shaped lock portions 57D, and the outer box body 56 is provided on its other side portion with protrusions 56D to be fitted in the lock portions 57D. Therefore, the outer box cover 57 can be firmly fixed on the outer box body 56 by fitting the lock portions 57D on the protrusions 56D of the outer box body 56 and then by fastening the bracket portions 56A and 57A by the bolts.

On the other hand, reference numerals 56B and 57B designate bulges which are formed on the outer box body 56 and the outer box cover 57 protruded to outer direction for housing the communication passage 64 of the cooling panel 55. Reference numerals 56C and 57C designate bulges which are formed on the outer box body 56 protruded to outer direction and the outer box cover 57 for housing the communication passage 63 of the cooling panel 55.

Figure 20:
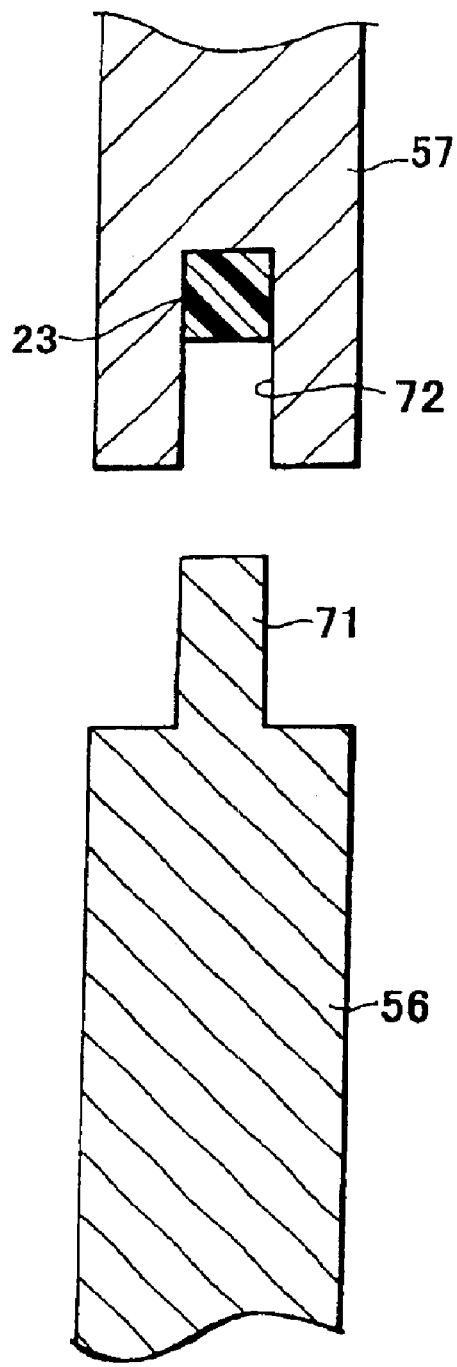
FIG. 20 is a transverse sectional view showing the construction of a joint portion between an outer box body and an outer box cover of the specific embodiment.

At the individual joint end portions of the outer box body 56 and the outer box cover 57, as shown in FIG. 20, there are formed a groove and a ridge for meshing with each other. A seal member 73 is fixed on the upper bottom portion of the groove.

On the generally central portion of the wall portion in the thickness direction at the joint end portion of the outer box body 56, more specifically, there is formed a ridge 71 of a rectangular transverse section, which protrudes upward to a predetermined extent. In the generally central portion of the wall portion in the thickness direction at the joint end portion of the outer box cover 57, there is correspondingly formed a groove 72 of a rectangular transverse section, which is recessed to a predetermined depth.

Moreover, the elastically deformable seal member 73 is fixed on the bottom portion of that groove 72. The seal member 73 is made of a material of a rich elasticity and a water-proof, such as independently foamed rubber.

Therefore, a plurality of steps are formed at the joint portion between the outer box body 56 and the outer box cover 57, and the seal member 73 is fitted on the joint portion. After the outer box body 56 and the outer box cover 57 were assembled, the seal member 73 of the groove 72 elastically deforms to come into close contact with the ridge 71 so that no clearance can be left at the joint portion thereby to retain the sealing performance sufficiently as the housing box 51.

Moreover, a groove is formed in the joint end portion of the outer box cover 57, i.e., the groove 72 is formed downward, so that it is freed from being clogged with the fine dust. At the same time, a ridge is formed on the joint end portion of the outer box body 56, i.e., the ridge is formed upward, so that it is freed from being contaminated with the fine dust. Even if the outer box cover 57 is repeatedly mounted on or demounted from the outer box body 56 for inspecting or maintaining the electronic units 53A and 53B, therefore, the sealing property at the joint portion between the outer box cover 57 and the outer box body 56 can be retained to keep the sealing performance of the housing box 51.

Although the invention has been described in connection with its embodiments, it should not be limited thereto but can be modified in various manners. For example, the single passage is defined and formed in each hollow body. However, the passage may be once divided into a plurality of passages, and these branch passages may be collected at a communication passage leading out of the hollow body. Moreover, there may be provided a plurality of communication passages for feeding the cooling air from the lower hollow body 61 to the upper hollow body 62, and there may be provided a plurality of communication passages for feeding the cooling air from the upper hollow body 62 to the lower hollow body 61. Accordingly, the passage in each hollow body may be divided and formed into a plurality of passages.

According to the cooling device thus constructed, as has been described hereinbefore, a cooling panel is constructed such that the upper face of one electronic unit is confronted by the bottom face of a hollow body, such that the other electronic unit is placed on the hollow body, and such that the upper face of the hollow body is confronted by the bottom face of the other hollow body. These components are stacked, and a plurality of communication passages are provided for connecting the individual hollow bodies to each other. Thus, the cooling panel is small-sized to make the housing box compact for housing the cooling panel.

With the construction in which the upper faces of the electronic units are confronted by the individual hollow bodies, moreover, the operating heats of the electronic units can be carried away the upper faces, in which the heats are easily concentrated by the natural convections in the electronic units, by the cooling air flowing in the hollow bodies. Therefore, a high cooling efficiency can be achieved to retain a sufficient cooling performance for the cooling panel housing the two electronic units.

Moreover, the communication passages of the cooling panel are provided bypassing the electronic unit interposed between the hollow bodies connected therethrough, so that the cooling device has the communication passages only around the side faces of the electronic unit. Therefore, the obstacles around the side faces of the electronic unit are reduced to the minimum. When the cooling panel is housed in the housing box, the electronic unit can be easily wired and handled, and the space for arranging the various fixing brackets can be retained in the housing box thereby to improve the degree of freedom for the design.

Moreover, the inlet and outlet of the cooling panel are disposed close to each other and on the side face of one hollow body, so that the conduits to be connected to those inlet and outlet can be collected substantially at one position. It is, therefore, possible to improve the mountability of the conduits and to prevent the conduits from interfering with the wires to be connected with the electronic unit or the surrounding structures, thereby to improve the degree of freedom for the design.

Moreover, the single opening is formed in the housing box so that the inlet and the outlet, as arranged close to each other, of the cooling panel may be formed to extend to the outside of the housing box and to pass through the wall portion of the housing box. As compared with the construction in which two separate openings are formed for the inlet and the outlet, therefore, only one opening can be sufficient for the housing box to lower the working cost and to improve the sealing property and the structural strength of the housing box.

Moreover, the seal member is mounted in advance midway of the extensions of the inlet and the outlet so that it can be interposed between the inlet and the outlet and the opening of the housing box without sealing them without any clearance, merely by assembling the cooling panel having the electronic unit with the outer box body and by assembling the outer box cover with the outer box body. At this assembling time, the seal members for the inlet and the outlet need not be separately assembled to improve the assemblability.

Moreover, the outer box body and the outer box cover composing the housing box are fitted at their joint portion of the groove and the ridge, and the seal member is arranged in the groove so that the plurality of steps are formed at the joint portion between the outer box body and the outer box cover. After these outer box body and cover were assembled, the seal member in the groove is elastically deformed to come into close contact with the ridge so that no clearance can be left at the joint portion to retain the sealing performance sufficiently as the housing box.

On the other hand, the joint end portion of the outer box cover is provided with the downward groove so that the groove can be prevented from being clogged with the fine dust. Moreover, the joint end portion of the outer box body is provided with the upward ridge so that the ridge can be less contaminated with the fine dust. As a result, even if the upper cover member is repeatedly mounted on or demounted from the box body so as to inspect or maintain the electronic unit, the sealing property at the joint portion between the upper cover member and the box body can be retained to keep the sealing performance as the housing box.

What is claimed is:

1. An electronic unit cooling device for cooling an electronic unit having a plurality of electronic parts, indirectly with cooling air, comprising:

a cooling panel of a hollow structure for passing the cooling air therethrough, the cooling panel including a hollow upper side flat plate portion and a hollow lower side flat plate portion connected together at a hollow side end portion, such that the cooling panel forms a U-shape with a space between the upper and lower side flat plate portions, the cooling air entering from one of the upper or lower side flat plate portions, passing through the hollow portions of the upper and lower side flat plate portions and side end portion and exiting from the other of the upper or lower side flat plate portion at an area outside of the space between the upper and lower side flat plate portions;

a first heat receiving face formed on said upper side flat plate portion of said cooling panel; and a second heat receiving face formed on said lower side flat plate portion of said cooling panel.

2. A cooling device according to claim 1, wherein said cooling panel includes:

an inlet and an outlet for the cooling air; and a partition for dividing the inside of said cooling panel into a passage leading from said inlet to said outlet.

3. A cooling device according to claim 1, wherein said first heat receiving face includes a plane, and wherein said second heat receiving face includes a plane.

4. A cooling device according to claim 1, wherein said cooling panel includes a communication passage for providing the communication between the inside of said upper side flat plate portion and the inside of said lower side flat plate portion, and wherein an inlet of the communication passage is formed in said lower side flat plate portion whereas an outlet of the communication passage is formed in said upper side flat plate portion.

5. A cooling device according to claim 1, further comprising:

a housing box housing said cooling panel, hermetically.

6. An electronic unit cooling device for housing an electronic unit having a plurality of electronic parts and for indirectly cooling said electronic unit with cooling air which is introduced from the outside and discharged to the outside, comprising:

a cooling panel of a hollow structure including upper and lower side flat plate portions for passing the cooling air therethrough, such that the cooling panel forms a U-shape with a space between the upper and lower side flat plate portions, the cooling air entering through an inlet port of the cooling panel and exiting through an outlet port of the cooling panel at an area outside of the space between the upper and lower side flat plate portion; and a housing box housing said cooling panel and having an opening for passing the cooling air to said cooling panel, said opening accommodating both the inlet port and outlet port of the cooling panel.

7. A cooling device according to claim 6, further comprising:

an inlet and an outlet formed to communicate with the inside of said cooling panel and protruding from said opening to the outside of said housing box; and a seal member for sealing said inlet and outlet and said opening.

8. A cooling device according to claim 7, further comprising:

a partition disposed in said cooling panel for defining a passage from said inlet to said outlet.

9. A cooling device according to claim 6, wherein said cooling panel includes: a first panel unit as the lower side flat plate portion; a second panel unit as the upper side flat plate portion and arranged at a predetermined spacing on the upper side of said first panel unit; and a communication passage for providing the communication between said first panel unit and said second panel unit.

10. A cooling device according to claim 9, further comprising:

an inlet and an outlet formed in one of said first panel unit and said second panel unit and communicating with the inside of one of said panel units, wherein said communication passage includes: a first communication passage for passing the cooling air therethrough from said first panel unit to said second panel unit; and a second communication passage for passing the cooling air therethrough from said second panel unit to said first panel unit.

11. A cooling device according to claim 6, wherein said housing box includes: a body portion having an upward opening; and a cover member adapted to be mounted on the opening of said body portion.

12. An electronic unit cooling device for housing an electronic unit having a plurality of electronic parts and for indirectly cooling said electronic unit with the cooling air which is introduced from the outside and discharged to the outside, comprising:

a cooling panel of a hollow structure for passing the cooling air therethrough, wherein said cooling panel includes: a first panel unit; a second panel unit arranged at a predetermined spacing on the upper side of said first panel unit; and a communication passage for providing the communication between said first panel unit and said second panel unit;

a housing box housing said cooling panel and having an opening for passing the cooling air to said cooling panel; and an inlet and an outlet formed in one of said first panel unit and said second panel unit and communicating with the inside of one of said panel units;

wherein said communication passage includes: a first communication passage for passing the cooling air therethrough from said first panel unit to said second panel unit; and a second communication passage for passing the cooling air therethrough from said second panel unit to said first panel unit.

13. A cooling device according to claim 12, further comprising:

a partition disposed in each of said first panel unit and said second panel unit for defining and forming a series of passages leading from said inlet to said outlet.

14. An electronic unit cooling device for housing an electronic unit having a plurality of electronic parts and for indirectly cooling said electronic unit with the cooling air which is introduced from the outside and discharged to the outside, comprising:

a cooling panel of a hollow structure for passing the cooling air therethrough, wherein said cooling panel includes: a first panel unit; a second panel unit arranged at a predetermined spacing on the upper side of said first panel unit; and a communication passage for providing the communication between said first panel unit and said second panel unit;

a housing box housing said cooling panel and having an opening for passing the cooling air to said cooling panel; and an outlet formed in one of said first panel unit and said second panel unit and communicating with the inside of one of said panel units wherein said inlet and said outlet are protruded from said opening, further comprising:

a seal member for sealing said inlet and outlet and said opening.

15. A cooling device according to claim 14, wherein said inlet and said outlet are formed in the side face of one of said panel units and adjacent to each other.

16. A cooling device according to claim 14, further comprising:

another opening formed in said housing box for extracting a wire to the outside of said housing box; and another seal member mounted in said another opening.

17. An electronic unit cooling device for housing an electronic unit having a plurality of electronic parts and for indirectly cooling said electronic unit with the cooling air which is introduced from the outside and discharged to the outside, comprising:

a cooling panel of a hollow structure for passing the cooling air therethrough, wherein said cooling panel includes: a first panel unit; a second panel unit arranged at a predetermined spacing on the upper side of said first panel unit; and a communication passage for providing the communication between said first panel unit and said second panel unit;

a housing box housing said cooling panel and said electronic unit having an opening for passing the cooling air to said cooling panel; and a ridge formed all over the periphery of the opening of said body portion; a groove formed in the opening confronted by said body portion of said cover member for fitting said ridge therein; and a seal member arranged in said groove.

18. An electronic unit cooling device for housing an electronic unit having a plurality of electronic parts and for indirectly cooling said electronic unit with cooling air which is introduced from the outside and discharged to the outside, comprising:

a cooling panel of a hollow structure for passing the cooling air therethrough, the cooling air entering through an inlet port of the cooling panel and exiting through an outlet port of the cooling panel; and a housing box housing said cooling panel and having an opening for passing the cooling air to said cooling panel, said opening accommodating both the inlet port and outlet port of the cooling panel;

an inlet and an outlet formed to communicate with the inside of said cooling panel and protruding from said opening to the outside of said housing box; and a seal member for sealing said inlet and outlet and said opening.

19. A cooling device according to claim 18, further comprising:

a partition disposed in said cooling panel for defining a passage from said inlet to said outlet.

20. An electronic unit cooling device for housing an electronic unit having a plurality of electronic parts and for indirectly cooling said electronic unit with cooling air which is introduced from the outside and discharged to the outside, comprising:

a cooling panel of a hollow structure for passing the cooling air therethrough, the cooling air entering through an inlet port of the cooling panel and exiting through an outlet port of the cooling panel; and a housing box housing said cooling panel and having an opening for passing the cooling air to said cooling panel, said opening accommodating both the inlet port and outlet port of the cooling panel;

wherein said cooling panel includes: a first panel unit; a second panel unit arranged at a predetermined spacing on the upper side of said first panel unit; and a communication passage for providing the communication between said first panel unit and said second panel unit; and an inlet and an outlet formed in one of said first panel unit and said second panel unit and communicating with the inside of one of said panel units, wherein said communication passage includes: a first communication passage for passing the cooling air therethrough from said first panel unit to said second panel unit; and a second communication passage for passing the cooling air therethrough from said second panel unit to said first panel unit.

21. An electronic unit cooling device for housing an electronic unit having a plurality of electronic parts and for indirectly cooling said electronic unit with cooling air which is introduced from the outside and discharged to the outside, comprising:

a cooling panel of a hollow structure for passing the cooling air therethrough, the cooling air entering through an inlet port of the cooling panel and exiting through an outlet port of the cooling panel; and a housing box housing said cooling panel and having an opening for passing the cooling air to said cooling panel, said opening accommodating both the inlet port and outlet port of the cooling panel; and wherein said housing box includes: a body portion having an upward opening; and a cover member adapted to be mounted on the opening of said body portion.

* * * * *